US011350052B2

(12) United States Patent
Otaka

(10) Patent No.: US 11,350,052 B2
(45) Date of Patent: May 31, 2022

(54) SOLID-STATE IMAGING DEVICE, METHOD FOR DRIVING SOLID-STATE IMAGING DEVICE, AND ELECTRONIC APPARATUS WITH SRAM INCLUDING A VIRTUAL POWER SUPPLY AND VIRTUAL REFERENCE POTENTIAL

(71) Applicant: BRILLNICS SINGAPORE PTE. LTD., Singapore (SG)

(72) Inventor: Toshinori Otaka, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 351 days.

(21) Appl. No.: 16/738,914

(22) Filed: Jan. 9, 2020

(65) Prior Publication Data
US 2020/0228745 A1 Jul. 16, 2020

(30) Foreign Application Priority Data
Jan. 11, 2019 (JP) .............................. JP2019-003153

(51) Int. Cl.
*H04N 5/3745* (2011.01)
*G11C 5/14* (2006.01)
(Continued)

(52) U.S. Cl.
CPC ......... *H04N 5/37455* (2013.01); *G11C 5/147* (2013.01); *G11C 7/12* (2013.01);
(Continued)

(58) Field of Classification Search
CPC .... H04N 5/37455; H04N 5/378; G11C 5/147; G11C 7/12; G11C 11/412; G11C 11/419; H03M 1/56
See application file for complete search history.

(56) References Cited

U.S. PATENT DOCUMENTS 7,164,114 B2 1/2007 Lai et al.
2003/0231538 A1* 12/2003 Rimondi ................. G11C 7/20
365/202
(Continued)

FOREIGN PATENT DOCUMENTS

JP 2005-278135 A 10/2005
JP 2005-295346 A 10/2005

OTHER PUBLICATIONS

European Search Report, Extended European Search Report issued in EP Patent Application No. 20151185.4, dated May 14, 2020, pp. 1-5.

*Primary Examiner* — Nicholas G Giles
(74) *Attorney, Agent, or Firm* — Pillsbury Winthrop Shaw Pittman LLP

(57) ABSTRACT

Provided are a solid-state imaging device, a method for driving a solid-state imaging device and an electronic apparatus. A memory part is formed using an SRAM serving as an ADC memory, and an ADC code is written into and read from the memory part under control of a reading part. In the SRAM, a power gating transistor is additionally provided to both of a power supply node (between a power supply and a virtual power supply node) and a ground node (between a virtual reference potential node and a reference potential) for the purposes of blocking the shoot-through currents from the bit cells during the writing operation. The power gating transistors are controlled by the reading part so as to operate as either a weak current source or switch.

19 Claims, 29 Drawing Sheets

(51) Int. Cl.
    *G11C 7/12*           (2006.01)
    *G11C 11/412*      (2006.01)
    *G11C 11/419*      (2006.01)
    *H03M 1/56*        (2006.01)
    *H04N 5/378*       (2011.01)

(52) U.S. Cl.
    CPC .......... *G11C 11/412* (2013.01); *G11C 11/419* (2013.01); *H03M 1/56* (2013.01); *H04N 5/378* (2013.01)

(56) References Cited

U.S. PATENT DOCUMENTS

| | | | |
|---|---|---|---|
| 2005/0195304 A1 | 9/2005 | Nitta et al. | |
| 2006/0206739 A1* | 9/2006 | Kim | G11C 7/02 |
| | | | 713/322 |
| 2007/0268740 A1* | 11/2007 | Aly | G11C 11/412 |
| | | | 365/154 |
| 2008/0055967 A1 | 3/2008 | Houston et al. | |
| 2010/0181464 A1 | 7/2010 | Veeder | |
| 2015/0003174 A1* | 1/2015 | Joshi | G11C 5/145 |
| | | | 365/189.11 |
| 2018/0152650 A1 | 5/2018 | Sakakibara et al. | |
| 2021/0027833 A1* | 1/2021 | Chowdhury | G11C 11/419 |

* cited by examiner

Light to time conversion plot at various reference voltage at comparator input

Read out timing example

SOLID-STATE IMAGING DEVICE, METHOD FOR DRIVING SOLID-STATE IMAGING DEVICE, AND ELECTRONIC APPARATUS WITH SRAM INCLUDING A VIRTUAL POWER SUPPLY AND VIRTUAL REFERENCE POTENTIAL

CROSS-REFERENCE TO RELATED APPLICATIONS

This application is based on and claims the benefit of priority from Japanese Patent Application Serial No. 2019-003153 (filed on Jan. 11, 2019), the contents of which are hereby incorporated by reference in their entirety.

TECHNICAL FIELD

The present invention relates to a solid-state imaging device, a method for driving a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

The CMOS image sensor includes, for each pixel, a photodiode (a photoelectric conversion element) and a floating diffusion (FD) amplifier having a floating diffusion (FD). The mainstream design of the reading operation in the CMOS image sensor is a column parallel output processing of selecting one of the rows in the pixel array and reading the pixels in the selected row simultaneously in the column output direction.

Various types of pixel signal reading (output) circuits have been proposed for CMOS image sensors of the column parallel output scheme. Among them, one of the most advanced circuits is a circuit that includes an analog-to-digital converter (ADC) for each column and obtains a pixel signal in a digital format (see, for example, Japanese Patent Application Publications Nos. 2005-278135 and 2005-295346).

In this CMOS image sensor having column-parallel ADCs (column-wise-AD CMOS image sensor), a comparator compares the pixel signal against a so-called RAMP wave and a counter of a later stage performs digital CDS, so that AD conversion is performed.

This type of CMOS image sensors is capable of transferring signals at high speed, but disadvantageously is not capable of reading the signals with a global shutter.

To address this issue, a digital pixel sensor has been proposed that has, in each pixel, an ADC including a comparator (and additionally a memory part) so that the sensor can realize a global shutter according to which the exposure to light can start and end at the same timing in all of the pixels of the pixel array part (see, for example, U.S. Pat. No. 7,164,114 B2 FIG. 4 and US 2010/0181464 A1).

In the above-described digital pixel sensor, each pixel uses a static random access memory (SRAM) as the digital memory for saving therein ADC code data resulting from the AD conversion. Unless the power supply is cut off, the ADC code stored in the SRAM memory can be preserved. Therefore, the SRAM is essentially more beneficial than dynamic random memory (DRAM) or other types of dynamic memory elements.

The usage of the SRAM as the pixel ADC memory can present the following three advantages. Firstly, the SRAM bit cells are compact. In the case of a DRAM capacitor (condenser), the capacitance is typically determined by the surface area. Unlike the DRAM capacitor (condenser), the size of the digital memory does not need to be increased in order to achieve an extended retaining time. The leakage currents can be addressed. Therefore, it is possible to achieve a smaller ADC memory region. This can contribute to reduce the pixels (the pixel pitch) and to achieve a smaller camera system.

Secondly, the SRAM process is scalable to achieve highly sophisticated logic process. Therefore, as the semiconductor process node evolves, the size of the SRAM bit cell automatically decreases. Using highly advanced logic process can further reduce the pixel pitch or increase the number of ADC bits included in the pixel, so that the image quality can be improved. For example, digital correlated double sampling can be performed, which requires more memory bits.

Thirdly, the ADC code stored in the SRAM memory in each pixel is never lost unless the SRAM bit cell receives proper power supply. Accordingly, the system does not lose the obtained image data and can read what is stored in the SRAM whenever necessary.

The greatest challenge in using SRAM in the digital pixel is how to perform writing at the same time in all of the pixels. The digital pixel is capable of operating in both a global shutter (GS) mode and a rolling shutter (RS) mode. The digital pixel is very suitable for the GS operation since each digital pixel has an ADC therein. With the digital pixels, the GS operation, which is one of the main advantages of the DPS, is automatically made available, unlike a conventional CMOS image sensor (CIS).

In the GS mode, a single writing driver needs to drive all of the SRAM bit cells in a single column, unlike a normal SRAM memory array in which only one SRAM bit cell in a single column is subject to writing at a time.

A general SRAM includes six transistors. Specifically speaking, the general SRAM includes two back-to-back inverters and two NMOS switches. Considering the characteristics of the back-to-back inverters, large currents are required to invert what is stored in the SRAM bit cell (the state of the SRAM bit cell). Accordingly, this step generates large shoot-through currents.

Simulation results indicate that, in the case of a standard 65-nm-process-node SRAM, approximately 100 μA is required to invert the memory cell. In this case, the total currents required for writing amounts to approximately 100 mA (=100 μA×1000 pix) in a hypothetical case of a one-megapixel array where pixels are arranged in 1000×1000 pattern and each column includes 1000 pixels.

Even if a writing driver provided for each column is capable of feeding such large currents, the parasitic resistance on the column bit line, which can be estimated to be approximately 10 kilo-ohm (10 ohm/row), can cause IR drop that intersects the bit line. As a consequence, the writing operation can be impeded, or the SRAM writing operation is significantly slowed down.

A CMOS image sensor having the above-mentioned conventional digital pixel sensor can realize a global shutter function but has only limited success in achieving a wider dynamic range and a higher frame rate since the charges overflowing from the photodiodes in the storing period are not used real time, for example.

One of the key performance indices of the CMOS image sensor is random noise, which mainly originates from the pixels and ADCs as is known in the art. It is generally known that the random noise can be reduced by increasing the transistor size to reduce flicker noise or by adding a capacitor to the output of the comparator to lower the band so that the CDS effectively serves as a noise filter. Due to the increased area and capacitance, however, these techniques experience worse inversion delay in the comparator. This disadvantageously encounter difficulties in raising the frame rate of the imaging element.

Furthermore, since each pixel has an ADC including a comparator (additionally, a memory part), it is difficult to maximize the effective pixel region and the value per cost.

The present invention is designed to provide a solid-state imaging device, a method for driving a solid-state imaging device, and an electronic apparatus that are capable of effectively blocking the shoot-through currents from SRAM bit cells while writing is performed on the bit cells and achieving excellent writing operations. The present invention is designed to provide a solid-state imaging device, a method for driving a solid-state imaging device, and an electronic apparatus that are capable of effectively blocking the shoot-through currents from SRAM bit cells while writing is performed on the bit cells, achieving excellent writing operations, and accomplishing a substantially widened dynamic range and an enhanced frame rate. Furthermore, the present invention is designed to provide a solid-state imaging device, a method for driving a solid-state imaging device, and an electronic apparatus that are capable of effectively blocking the shoot-through currents from SRAM bit cells while writing is performed on the bit cells, achieving excellent writing operations, accomplishing a substantially widened dynamic range and an enhanced frame rate, realizing a reduced noise and maximizing the effective pixel region and the value per cost.

SUMMARY

A first aspect of the present invention provides a solid-state imaging device including a pixel part having a pixel arranged therein, where the pixel performs photoelectric conversion, and a reading part for reading a pixel signal from the pixel in the pixel part. The pixel has a photoelectric conversion element for storing therein, in a storing period, charges generated by the photoelectric conversion, a transfer element for transferring, in a transfer period following the storing period, the charges stored in the photoelectric conversion element, an output node to which the charges stored in the photoelectric conversion element are transferred through the transfer element, an output buffer part for converting the charges in the output node into a voltage signal at a level determined by the amount of the charges and outputting the voltage signal, a comparator for performing, for analog-to-digital (AD) conversion, a comparing operation of comparing the voltage signal output from the output buffer part against a referential voltage to output a digital comparison result signal, and a memory part for saving analog-to-digital code (ADC) data corresponding to the comparison result signal from the comparator. The memory part is formed using a static random access memory (SRAM), and an ADC code is written into and read from the memory part under control of the reading part. The SRAM includes a first bit line and a second bit line, a power supply, a reference potential, a virtual power supply node, a virtual reference potential node, a first first-conductivity-type transistor connected between the power supply and the virtual power supply node, a first second-conductivity-type transistor connected between the reference potential and the virtual reference potential node, a first back-to-back inverter including a second first-conductivity-type transistor having a source connected to the virtual power supply node and a second second-conductivity-type transistor having a source connected to the virtual reference potential node, where a gate of the second first-conductivity-type transistor is connected to a gate of the second second-conductivity-type transistor to form a first input node and a drain of the second first-conductivity-type transistor is connected to a drain of the second second-conductivity-type transistor to form a first output node, a second back-to-back inverter including a third first-conductivity-type transistor having a source connected to the virtual power supply node and a third second-conductivity-type transistor having a source connected to the virtual reference potential node, where a gate of the third first-conductivity-type transistor is connected to a gate of the third second-conductivity-type transistor to form a second input node and drain of the third first-conductivity-type transistor is connected to a drain of the third second-conductivity-type transistor to form a second output node, a first access transistor connected between the first output node and the first bit line, and a second access transistor connected between the second output node and the second bit line. The first input node is connected to the second output node, and the second input node is connected to the first output node.

A second aspect of the present invention provides a method for driving a solid-state imaging device including a pixel part having a pixel arranged therein, where the pixel performs photoelectric conversion, and a reading part for reading a pixel signal from the pixel in the pixel part. The pixel has a photoelectric conversion element for storing therein, in a storing period, charges generated by the photoelectric conversion, a transfer element for transferring, in a transfer period following the storing period, the charges stored in the photoelectric conversion element, an output node to which the charges stored in the photoelectric conversion element are transferred through the transfer element, an output buffer part for converting the charges in the output node into a voltage signal at a level determined by the amount of the charges and outputting the voltage signal, a comparator for performing, for analog-to-digital (AD) conversion, a comparing operation of comparing the voltage signal output from the output buffer part against a referential voltage to output a digital comparison result signal, and a memory part for saving analog-to-digital code (ADC) data corresponding to the comparison result signal from the comparator. The memory part is formed using static random access memory (SRAM), and an ADC code is written into and read from the memory part under control of the reading part. The SRAM includes a first bit line and a second bit line, a power supply, a reference potential, a virtual power supply node, a virtual reference potential node, a first first-conductivity-type transistor connected between the power supply and the virtual power supply node, a first second-conductivity-type transistor connected between the reference potential and the virtual reference potential node, a first back-to-back inverter including a second first-conductivity-type transistor having a source connected to the virtual power supply node and a second second-conductivity-type transistor having a source connected to the virtual reference potential node, where a gate of the second first-conductivity-type transistor is connected to a gate of the second secondconductivity-type transistor to form a first input node and a drain of the second first-conductivity-type transistor is connected to a drain of the second second-conductivity-type transistor to form a first output node, a second back-to-back inverter including a third first-conductivity-type transistor having a source connected to the virtual power supply node and a third second-conductivity-type transistor having a source connected to the virtual reference potential node, where a gate of the third first-conductivity-type transistor is connected to a gate of the third second-conductivity-type transistor to form a second input node and a drain of the third first-conductivity-type transistor is connected to a drain of the third second-conductivity-type transistor to form a second output node, a first access transistor connected between the first output node and the first bit line, and a second access transistor connected between the second output node and the second bit line. The first input node is connected to the second output node, and the second input node is connected to the first output node. When the pixel signal is read out from the pixel, in the memory part, under control of the reading part, a gate voltage of at least the first first-conductivity-type transistor selected from among the first first-conductivity-type transistor and the first second-conductivity-type transistor is controlled so that at least the first first-conductivity-type transistor operates as a weak current source or switch, the gate voltage of at least the first first-conductivity-type transistor is controlled such that at least the first first-conductivity-type transistor operates as a weak current source in an AD conversion period in which AD conversion is performed and an ADC code is written, and the gate voltage of at least the first first-conductivity-type transistor is controlled such that at least the first first-conductivity-type transistor operates as a switch in a reading period following the AD conversion period.

A third aspect of the present invention provides an electronic apparatus including a solid-state imaging device, and an optical system for forming a subject image on the solid-state imaging device. The solid-state imaging device includes a pixel part having a pixel arranged therein, where the pixel performs photoelectric conversion, and a reading part for reading a pixel signal from the pixel in the pixel part. The pixel has a photoelectric conversion element for storing therein, in a storing period, charges generated by the photoelectric conversion, a transfer element for transferring, in a transfer period following the storing period, the charges stored in the photoelectric conversion element, an output node to which the charges stored in the photoelectric conversion element are transferred through the transfer element, an output buffer part for converting the charges in the output node into a voltage signal at a level determined by the amount of the charges and outputting the voltage signal, a comparator for performing, for analog-to-digital (AD) conversion, a comparing operation of comparing the voltage signal output from the output buffer part against a referential voltage to output a digital comparison result signal, and a memory part for saving analog-to-digital code (ADC) data corresponding to the comparison result signal from the comparator. The memory part is formed using static random access memory (SRAM), and an ADC code is written into and read from the memory part under control of the reading part. The SRAM includes a first bit line and a second bit line, a power supply, a reference potential, a virtual power supply node, a virtual reference potential node, a first first-conductivity-type transistor connected between the power supply and the virtual power supply node, a first second-conductivity-type transistor connected between the reference potential and the virtual reference potential node, a first back-to-back inverter including a second first-conductivity-type transistor having a source connected to the virtual power supply node and a second second-conductivity-type transistor having a source connected to the virtual reference potential node, where a gate of the second first-conductivity-type transistor is connected to a gate of the second second-conductivity-type transistor to form a first input node and a drain of the second first-conductivity-type transistor is connected to a drain of the second second-conductivity-type transistor to form a first output node, a second back-to-back inverter including a third first-conductivity-type transistor having a source connected to the virtual power supply node and a third second-conductivity-type transistor having a source connected to the virtual reference potential node, where a gate of the third first-conductivity-type transistor is connected to a gate of the third second-conductivity-type transistor to form a second input node and a drain of the third first-conductivity-type transistor is connected to a drain of the third second-conductivity-type transistor to form a second output node, a first access transistor connected between the first output node and the first bit line, and a second access transistor connected between the second output node and the second bit line. The first input node is connected to the second output node, and the second input node is connected to the first output node.

Advantages

According to the present invention, the shoot-through currents from SRAM bit cells can be effectively blocked while writing is performed on the bit cells and excellent writing operations can be achieved. According to the present invention, the shoot-through currents from SRAM bit cells can be effectively blocked while writing is performed on the bit cells, excellent writing operations can be achieved, and a substantially widened dynamic range and an enhanced frame rate can be achieved. Furthermore, according to the present invention, the shoot-through currents from SRAM bit cells can be effectively blocked while writing is performed on the bit cells, excellent writing operations can be achieved, a substantially widened dynamic range and an enhanced frame rate can be accomplished, a reduced noise can be realized and the effective pixel region and the value per cost can be maximized.

DESCRIPTION OF THE EMBODIMENTS

Embodiments of the present invention will be hereinafter described with reference to the drawings.

First Embodiment

Figure 1:
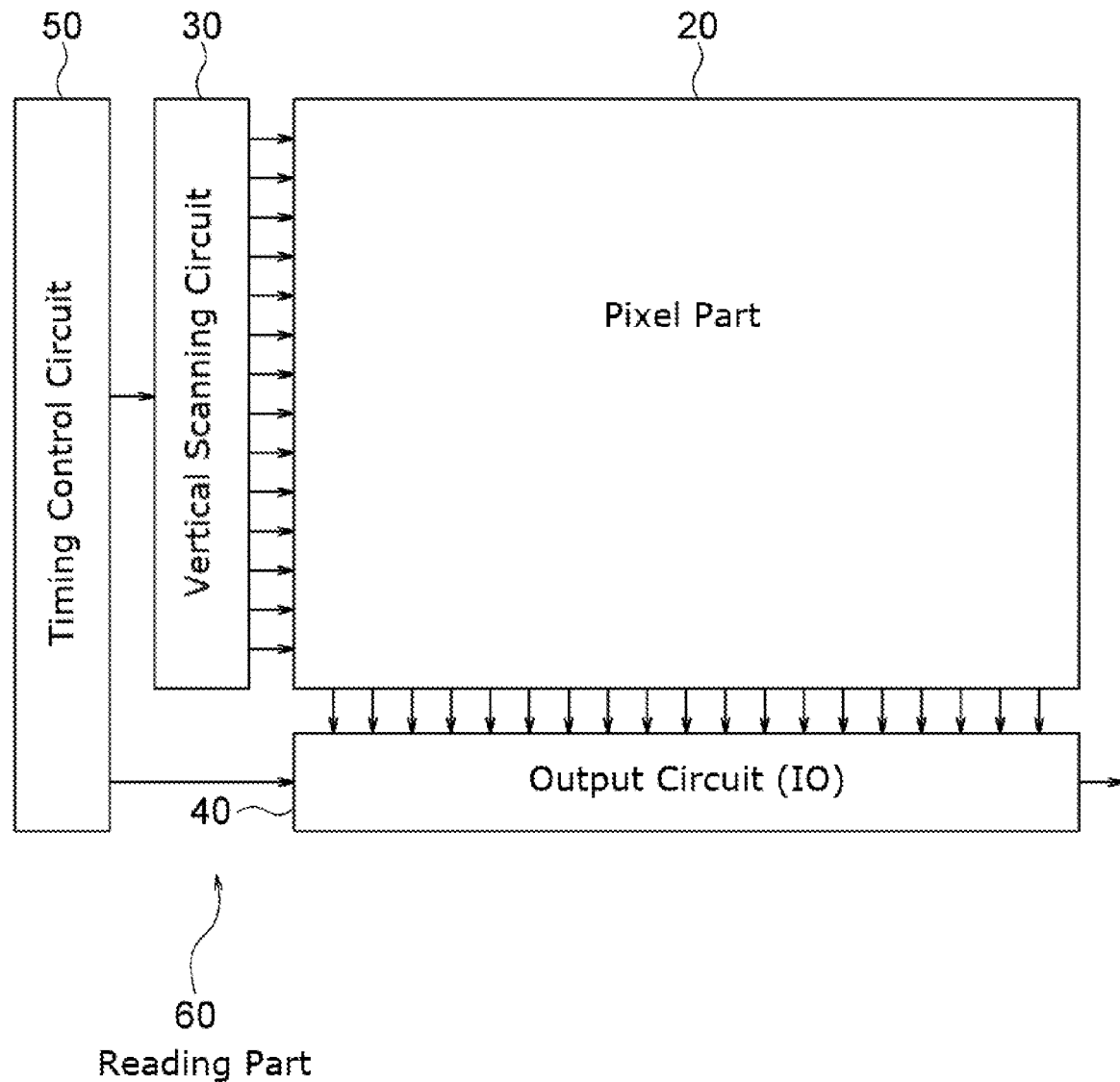
FIG. 1 is a block diagram showing an example configuration of a solid-state imaging device according to a first embodiment of the present invention.

FIG. 1 is a block diagram showing an example configuration of a solid-state imaging device relating to a first embodiment of the present invention. In this embodiment, the solid-state imaging device 10 is constituted by, for example, a CMOS image sensor having a digital pixel as a pixel thereof.

As shown in FIG. 1, the solid-state imaging device 10 is constituted mainly by a pixel part 20 serving as an image capturing part, a vertical scanning circuit (a row scanning circuit) 30, an output circuit 40, and a timing control circuit 50. Among these components, for example, the vertical scanning circuit 30, the output circuit 40, and the timing control circuit 50 constitute a reading part 60 for reading pixel signals.

In the solid-state imaging device 10 relating to the first embodiment, the pixel part 20 includes digital pixels, and each digital pixel includes a photoelectric conversion reading part, an analog-to-digital (AD) converting part, and a memory part. The solid-state imaging device 10 is configured, for example, as a stacked CMOS image sensor capable of operating in a global shutter mode. In the solid-state imaging device 10 relating to the first embodiment, as will be described in detail below, each digital pixel DP has an AD converting function, and the AD converting part includes a comparator for performing a comparing operation of comparing the voltage signal read out by the photoelectric conversion reading part against a referential voltage and outputting a digital comparison result signal. Under the control of the reading part 60, the comparator performs a first comparing operation and a second comparing operation. The first comparing operation is designed to output a digital first comparison result signal obtained by processing the voltage signal corresponding to the overflow charges that overflow from the photoelectric conversion element to the output node (floating diffusion) in a storing period. The second comparing operation is designed to output a digital second comparison result signal obtained by processing the voltage signal corresponding to the charges stored in the photoelectric conversion element that are transferred to the output node in a transfer period following the storing period.

The solid-state imaging device 10 relating to the first embodiment includes a memory part for saving therein analog-to-digital code (ADC) data corresponding to the comparison result signal from the comparator. The memory part is formed using static random access memory (SRAM) and the ADC code is written into and read out from the memory part under the control of the reading part 60. In the SRAM relating to the present embodiment, a power gating transistor is additionally provided to both of a power supply node (between a power supply and a virtual power supply node) and a ground node (between a virtual reference potential node and a reference potential) for the purposes of blocking the shoot-through currents from the bit cells during the writing operation, as will be described in detail below. The power gating transistors are controlled by the reading part 60 so as to operate as either a weak current source or switch.

In the present embodiment, the reading part 60 controls the gate voltage of the power gating transistors such that they operate as a weak current source in an AD conversion period in which AD conversion is performed and the resulting ADC code is written and controls the gate voltage of the power gating transistors such that they operate as a switch in a reading period following the AD conversion period.

The following outlines the configurations and functions of the parts of the solid-state imaging device 10. In particular, the configurations and functions of the pixel part 20 and the digital pixel and the relating reading operation will be described in detail, and the stacked structure of the pixel part 20 and the reading part 60 and other features will be also described in detail.

<Configurations of Pixel Part 20 and Digital Pixel 200>

Figure 2:
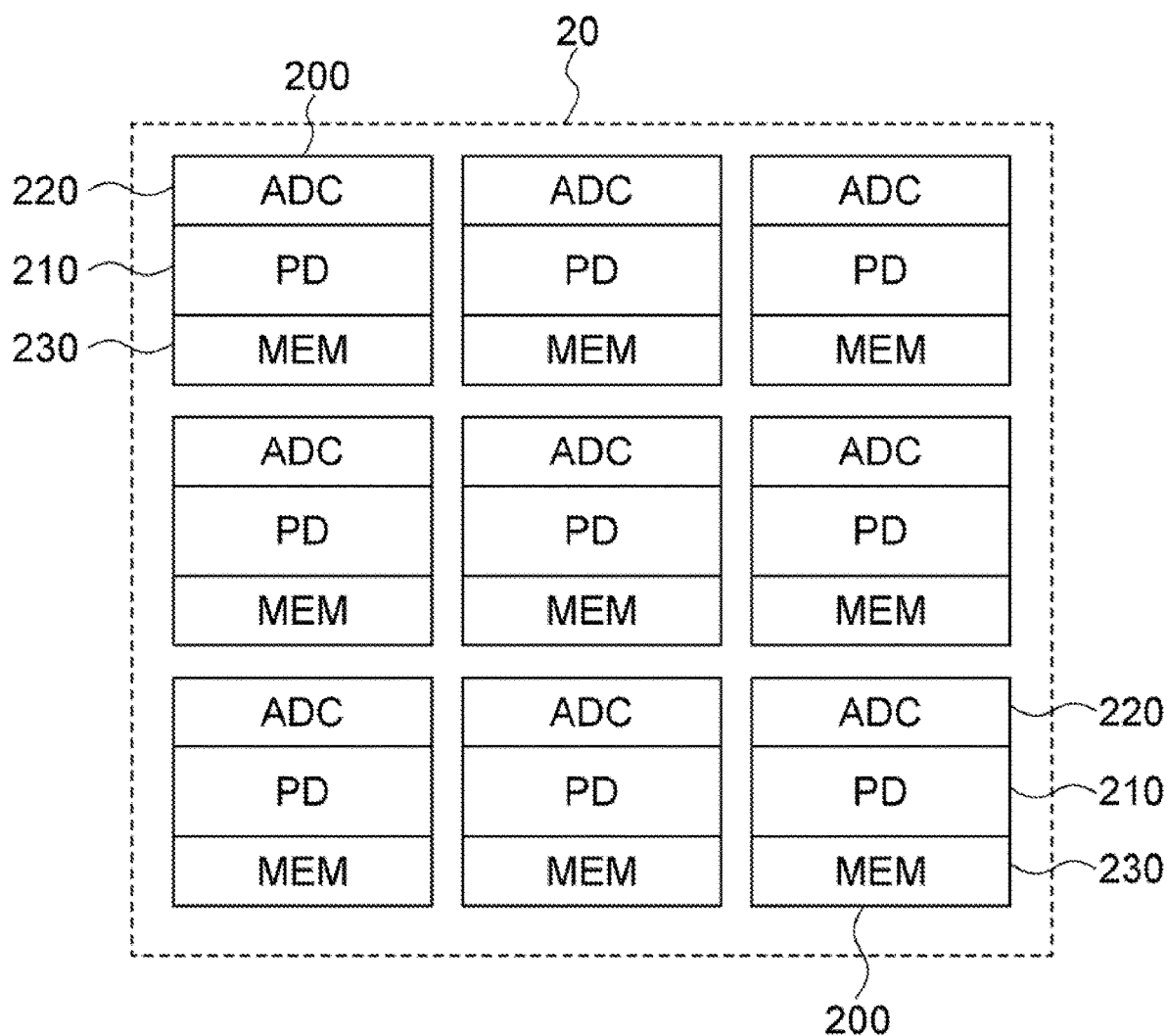
FIG. 2 shows an example of a digital pixel array of a pixel part of the solid-state imaging device relating to the first embodiment of the present invention.
Figure 3:
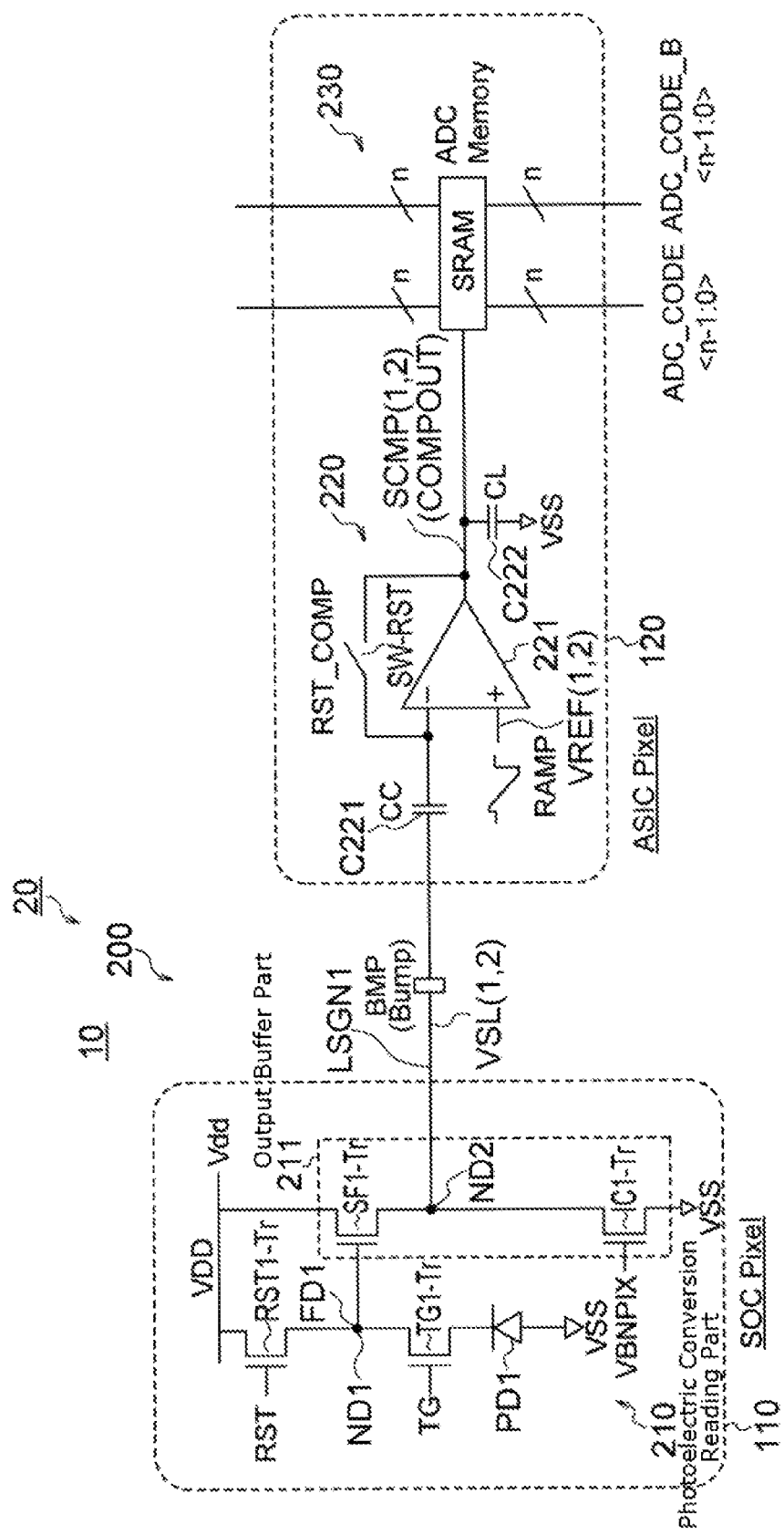
FIG. 3 is a circuit diagram showing an example of a pixel of the solid-state imaging device relating to the first embodiment of the present invention.

FIG. 2 shows an example of the digital pixel array of the pixel part of the solid-state imaging device 10 relating to the first embodiment of the present invention. FIG. 3 is a circuit diagram showing an example of the pixel of the solid-state imaging device 10 relating to the first embodiment of the present invention.

In the pixel part 20, as shown in FIG. 2, a plurality of digital pixels 200 are arranged in a matrix of N rows and M columns. FIG. 2 shows an example where nine digital pixels 200 are arranged in a matrix of three rows and three columns (M=3, N=3) for the sake of simplicity.

The digital pixel 200 relating to the first embodiment includes a photoelectric conversion reading part (identified as "PD" in FIG. 2) 210, an AD converting part (identified as "ADC" in FIG. 2) 220, and a memory part (identified as "MEM" in FIG. 2) 230. The pixel part 20 relating to the first embodiment is configured as a stacked CMOS image sensor made up by a first substrate 110 and a second substrate 120, as will be described in detail below. In the present example, as shown in FIG. 3, the photoelectric conversion reading part 210 is formed in the first substrate 110, and the AD converting part 220 and the memory part 230 are formed in the second substrate 120.

The photoelectric conversion reading part 210 of the digital pixel 200 includes a photodiode (a photoelectric conversion element) and an in-pixel amplifier. More specifically, the photoelectric conversion reading part 210 includes, for example, a photodiode PD1, which is a photoelectric conversion element. For the photodiode PD1, one transfer transistor TG1-Tr serving as a transferring element, one reset transistor RST1-Tr serving as a resetting element, one source follower transistor SF1-Tr serving as a source follower element, one current transistor IC1-Tr serving as a current source element, one floating diffusion FD1 serving as an output node ND1, and one reading node ND2 are provided. As described above, the photoelectric conversion reading part 210 of the digital pixel 200 relating to the first embodiment includes four transistors (4Tr), namely, the transfer transistor TG1-Tr, the reset transistor RST1-Tr, the source follower transistor SF1-Tr, and the current transistor IC1-Tr.

In the first embodiment, the source follower transistor SF1-Tr, the current transistor IC1-Tr, and the reading node ND2 together constitute an output buffer part 211.

In the photoelectric conversion reading part 210 relating to the first embodiment, the reading node ND2 of the output buffer part 211 is connected to the input part of the AD converting part 220. The photoelectric conversion reading part 210 converts the charges in the floating diffusion FD1 serving as an output node into a voltage signal at a level corresponding to the amount of the charges and outputs the voltage signal VSL to the AD converting part 220.

More specifically, the photoelectric conversion reading part 210 outputs, in a first comparing operation period PCMP1 of the AD converting part 220, a voltage signal VSL corresponding to the overflow charges overflowing from the photodiode PD1, which is a photoelectric conversion element, to the floating diffusion FD1 serving as an output node in a storing period PI.

Furthermore, the photoelectric conversion reading part 210 outputs, in a second comparing operation period PCMP2 of the AD converting part 220, a voltage signal VSL corresponding to the charges stored in the photodiode PD1 that are transferred to the floating diffusion FD1 serving as an output node in the transfer period PT following the storing period PI. The photoelectric conversion reading part 210 outputs a read-out reset signal (signal voltage) (VRST) and a read-out signal (signal voltage) (VSIG), as a pixel signal, to the AD converting part 220 in the second comparing operation period PCMP2.

The photodiode PD1 generates signal charges (electrons) in an amount determined by the amount of the incident light and stores the same. Description will be hereinafter given of a case where the signal charges are electrons and each transistor is an n-type transistor. However, it is also possible that the signal charges are holes or each transistor is a p-type transistor. Further, this embodiment is also applicable to the case where a plurality of photodiodes and transfer transistors share the transistors.

The photodiode (PD) in each digital pixel 200 is a pinned photodiode (PPD). On a substrate surface for forming the photodiodes (PDs), there is a surface level due to dangling bonds or other defects, and therefore, a lot of charges (dark current) are generated due to heat energy, so that signals fail to be read out correctly. In the case of a pinned photodiode (PPD), a charge storage part of the photodiode (PD) is buried in the substrate to reduce mixing of the dark current into signals.

The transfer transistor TG1-Tr of the photoelectric conversion reading part 210 is connected between the photodiode PD1 and the floating diffusion FD1 and controlled by a control signal TG applied to the gate thereof through a control line. The transfer transistor TG1-Tr remains selected and in the conduction state during a transfer period PT in which the control signal TG is at the high (H) level, to transfer to the floating diffusion FD1 the charges (electrons) produced by the photoelectric conversion and then stored in the photodiode PD1. After the photodiode PD1 and the floating diffusion FD1 are reset to a predetermined reset potential, the transfer transistor TG1-Tr enters the non-conduction state with the control signal TG being set to the low (L) level and the photodiode PD1 enters a storing period PI. Under these circumstances, if the intensity of the incident light is very high (the amount of the incident light is very large), the charges above the well capacity overflow into the floating diffusion FD1 as overflow charges through the overflow pass under the transfer transistor TG1-Tr.

The reset transistor RST1-Tr is connected between the power supply line Vdd of the power supply voltage (sometimes may be referred to as "the power supply potential") VDD and the floating diffusion FD1 and controlled by a control signal RST applied to the gate thereof through a control line. The reset transistor RST1-Tr remains selected and in the conduction state during a reset period in which the control signal RST is at the H level, to reset the floating diffusion FD1 to the potential of the power supply line Vdd of the power supply voltage VDD.

The source follower transistor SF1-Tr serving as a source follower element is connected at the source thereof to the reading node ND2, at the drain thereof to the power supply line Vdd, and at the gate thereof to the floating diffusion FD1. The drain and source of the current transistor IC1-Tr serving as a current source element are connected between the reading node ND2 and the reference potential VSS (for example, GND). The gate of the current transistor IC1-Tr is connected to the feeding line of a control signal VBNPIX.

The signal line LSGN1 between the reading node ND2 and the input part of the AD converting part 220 is driven by the current transistor IC1-Tr serving as a current source element.

Figure 4A:
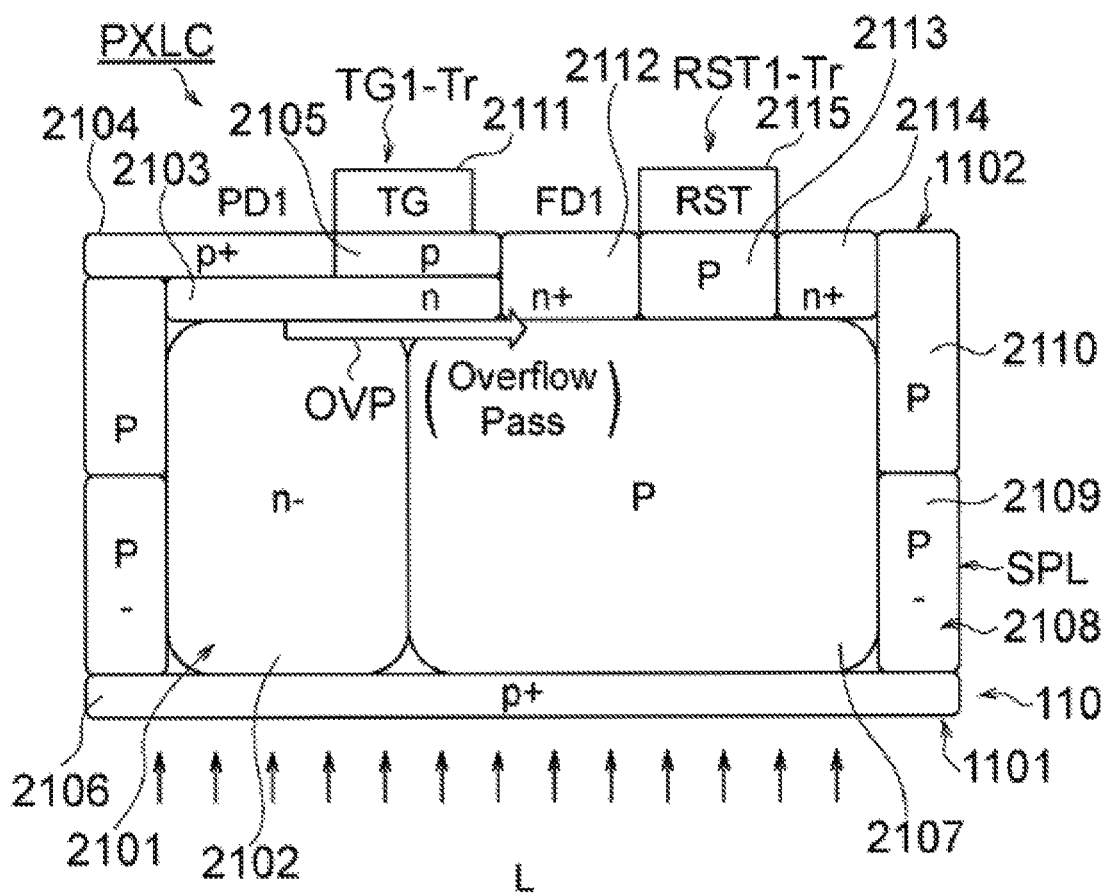
FIG. 4A is a simplified sectional view showing an example configuration of a charge storing and transferring system or the main part of a digital pixel relating to the first embodiment of the present invention.
Figure 4B:
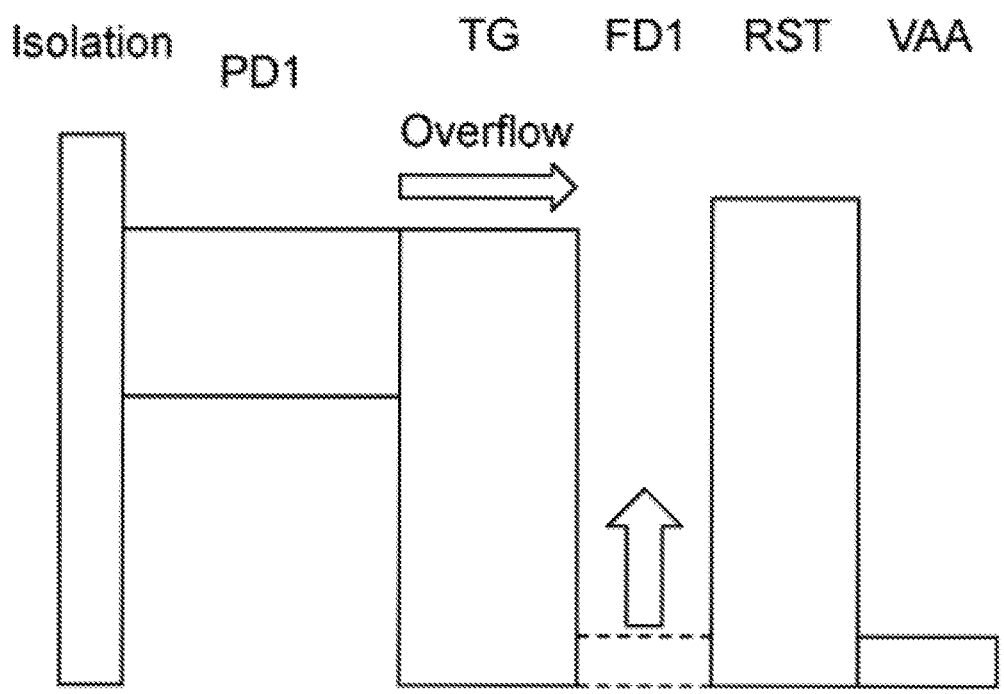
FIG. 4B is a potential diagram showing what happens during an overflow.

FIG. 4A is a simplified sectional view showing an example configuration of a charge storing and transferring system or the main part of the digital pixel relating to the first embodiment of the present invention, and FIG. 4B is a potential diagram showing what happens during an overflow.

Each digital pixel cell PXLC is formed on a substrate (in the present example, the first substrate 110) having a first substrate surface 1101 (for example, back surface) irradiated with light L and a second substrate surface 1102 that opposes the first substrate surface 1101 and defined by a separation layer SPL. The digital pixel cell PLXC shown in FIG. 4A includes the photodiode PD1, the transfer transistor TG1-Tr, the floating diffusion FD1 and the reset transistor RST1-T, which together form the photoelectric conversion reading part 210, the separation layer SPL, and a color filter part and a microlens, which are not shown.

<Configuration of Photodiode>

The photodiode PD1 includes a semiconductor layer of a first conductivity type (in the present embodiment, the n type) (in the present embodiment, the n layer) 2101 that is buried in the semiconductor substrate having the first substrate surface 1101 and the second substrate surface 1102 opposing the first substrate surface 1101, and is capable of photoelectrically convert the received light and storing charges. On the lateral portion of the photodiode PD1 in the direction orthogonal to the normal to the substrate (the X direction), a separation layer SPL of a second conductivity type (in the present embodiment, the p type) is formed.

As described above, in the present embodiment, each digital pixel cell PXLC uses a pinned photodiode (PPD) as the photodiode (PD). On a substrate surface for forming the photodiodes (PDs), there is a surface level due to dangling bonds or other defects, and therefore, a lot of charges (dark current) are generated due to heat energy, so that signals fail to be read out correctly. In the case of a pinned photodiode (PPD), a charge storage part of the photodiode (PD) is buried in the substrate to reduce mixing of the dark current into signals.

In the photodiode PD1 shown in FIG. 4A, the n layer (the first-conductivity-type semiconductor layer) 2101 has a two-layer structure in the normal direction to the substrate 110 (the Z direction in the orthogonal coordinate system shown in FIG. 4A). In the present example, an n– layer 2102 is the closest to the first substrate surface 1101 and an n layer 2103 is closer to the second substrate surface 1102 than the n– layer 2102 is, and a p+ layer 2104 and a p layer 2105 are further formed and positioned closer to the second substrate surface 1102 than then layer 2103 is. Furthermore, a p+ layer 2106 is formed and positioned closer to the first substrate surface 1101 than the n– layer 2102 is. The p+ layer 2106 is formed without a gap and covers not only the photodiode PD1 but also the separation layer SPL and further other digital pixel cells PXLC.

A color filter part is formed on the light incidence surface of the P+ layer 2106, and a microlens is further formed on the light incidence surface of the color filter part in a portion corresponding to the photodiode PD1 and a portion of the separation layer SPL.

The above-described configurations are shown only as examples. A single-layer structure may be employed, or a stacked structure made up by three, four or more layers may be alternatively applied.

<Configuration of Separation Layer in X Direction (Column Direction)>

When the p-type separation layer SPL is seen in the X direction (the column direction) in FIG. 4A, a first p layer (a second-conductive-type semiconductor layer) 2107 is formed on the right lateral portion of the n– layer 2102 of the photodiode PD1 in the direction orthogonal to the normal to the substrate (the X direction in the orthogonal coordinate system shown in FIG. 4A). In the p-type separation layer SPL, on the right side of the first p layer 2107 in the X direction, a second p layer (a second-conductivity-type semiconductor layer) 2108 is formed and has a two-layer structure in the normal direction to the substrate 110 (the Z direction in the orthogonal coordinate system shown in FIG. 4A). In the present example, in the second p layer 2108, a p– layer 2109 is closer to the first substrate surface 1101 and a p layer 2110 is closer to the second substrate surface 1102 than the p– layer 2109 is.

The above-described configurations are shown only as examples. A single-layer structure may be employed, or a stacked structure made up by three, four or more layers may be alternatively applied.

Similarly to the photodiode PD1, the p+ layer 2106 is formed on the first p layer 2107 and the second p– layer 2109 of the p-type separation layer SPL on the first substrate surface 1101 side thereof.

An n layer 2103 is formed such that overflow pass OVP partly covers the surface of the first p layer 2107 of the p-type separation layer SPL that faces the second substrate surface 1102. On a p layer 2105 that is formed on the surface of the n layer 2103 that faces the second substrate surface 1102, a gate electrode 2111 of the transfer transistor TG1-Tr is formed with a gate insulator sandwiched therebetween. On the surface of the first p layer 2107 in the p-type separation layer SPL facing the second substrate surface 1102, an n+ layer 2112 is formed, which is to be formed into the floating diffusion FD1, a p layer 2113 is formed adjacent to the n+ layer 2112, which is to be formed into the channel formation region of the reset transistor RST1-Tr, and an n+ layer 2114 is formed adjacent to the p layer 2113. On the p layer 2113, a gate electrode 2115 is formed with a gate insulator sandwiched therebetween.

With the above-described structure, if the intensity of the incident light is very high (the amount of the incident light is very large), the charges above the well capacity overflow into the floating diffusion FD1 as overflow charges through the overflow pass OVP under the transfer transistor TG1-Tr.

The AD converting part 220 of the digital pixel 200 compares the analog voltage signal VSL output from the photoelectric conversion reading part 210 against the referential voltage VREF, which has a ramp waveform varying with a predetermined gradient or a fixed voltage level, to convert the analog signal into a digital signal.

As shown in FIG. 3, the AD converting part 220 includes a comparator (COMP) 221, an input-side coupling capacitor C221, an output-side load capacitor C222, and a reset switch SW-RST.

In the comparator 221, a first input terminal or inversion input terminal (–) receives a voltage signal VSL fed thereto, which is output from the output buffer part 211 of the photoelectric conversion reading part 210 to the signal line LSGN1, a second input terminal or non-inversion input terminal (+) receives the referential voltage VREF fed thereto. The comparator 221 performs a comparing operation of comparing the voltage signal VST against the referential voltage VREF and outputting a digital comparison result signal SCMP.

The first input terminal or inversion input terminal (−) of the comparator 221 is connected to a coupling capacitor C221. In this way, the output buffer part 211 of the photoelectric conversion reading part 210 formed on the first substrate 110 is AC coupled to the input part of the comparator 221 of the AD converting part 220 formed on the second substrate 120, so that the noise can be reduced and high SNR can be achieved when the illuminance is low.

As for the comparator 221, the reset switch SW-RST is connected between the output terminal and the first input terminal or inversion input terminal (−), and the load capacitor C222 serving as a noise bandwidth limiting capacitor is connected between the output terminal and the reference potential VSS.

In the AD converting part 220, basically, the comparator 221 compares the analog signal (the potential VSL) read from the output buffer part 211 of the photoelectric conversion reading part 210 to the signal line LSGN1 against the referential voltage VREF, for example, a ramp signal RAMP that linearly changes with a certain gradient or has a slope waveform. During the comparison, the counter (not shown), which is provided for each column, is operating. The ramp signal RAMP having a ramp waveform and the value of the counter vary in a one-to-one correspondence, so that the voltage signal VSL is converted into a digital signal. Basically, the AD converting part 220 converts a change in voltage, in other words, a change in the referential voltage VREF (for example, the ramp signal RAMP) into a change in time, and counts the change in time at certain intervals (with certain clocks). In this way, a digital value is obtained. When the analog signal VSL and the ramp signal RAMP (the referential voltage VREF) cross each other, the output from the comparator 221 is inverted, the clock input into the counter is stopped or the suspended clock is input into the counter, and the value (data) of the counter at that timing is saved in the memory part 230. In this way, the AD conversion is completed. After the end of the above-described AD converting period, the data (signal) stored in the memory part 230 of each digital pixel 200 is output through the output circuit 40 to a signal processing circuit (not shown) and subject to predetermined signal processing, so that a two-dimensional image is produced.

<First and Second Comparing Operations in Comparator 221>

The comparator 221 of the AD converting part 220 of the first embodiment is driven and controlled by the reading part 60 to perform the following two types of or first and second comparing operations during a pixel signal reading period.

When performing the first comparing operation CMPR1, under the control of the reading part 60, the comparator 221 outputs a digital first comparison result signal SCMP1 obtained by processing a voltage signal VSL1 corresponding to the overflow charges overflowing from the photodiode PD1, which is a photoelectric conversion element, to the floating diffusion FD1, which is an output node, in the storing period PI. The first comparing operation CMPR1 may be referred to as a time stamp ADC mode operation.

When performing the second comparing operation CMPR2, under the control of the reading part 60, the comparator 221 outputs a digital second comparison result signal SCMP2 obtained by processing a voltage signal VSL2 (VSIG) corresponding to the charges stored in the photodiode PD1 that are transferred to the floating diffusion FD1, which is an output node, in the transfer period PT following the storing period PI. In the second comparing operation CMPR2, actually, before the voltage signal VSL2 (VSIG) corresponding to the stored charges is converted into a digital signal, a voltage signal VSL2 (VRRT) corresponding to the reset voltage in the floating diffusion FD1 at the time of resetting is converted into a digital signal. The second comparing operation CMPR2 may be referred to as a linear ADC mode operation.

In the present embodiment, the storing period PI basically denotes the period from when the photodiode PD1 and the floating diffusion FD1 are reset to the reset level to when the transfer transistor TG1-Tr is switched to the conduction state and the transfer period PT starts. The period PCMPR1 for the first comparing operation CMPR1 denotes the period from when the photodiode PD1 and the floating diffusion FD1 are reset to the reset level to when the floating diffusion FD1 is reset to the reset level before the transfer period PT starts. The period PCMPR2 for the second comparing operation CMPR2 denotes the period that starts after the floating diffusion FD1 is reset to the reset level and that includes a period after the transfer period PT.

Figure 5:
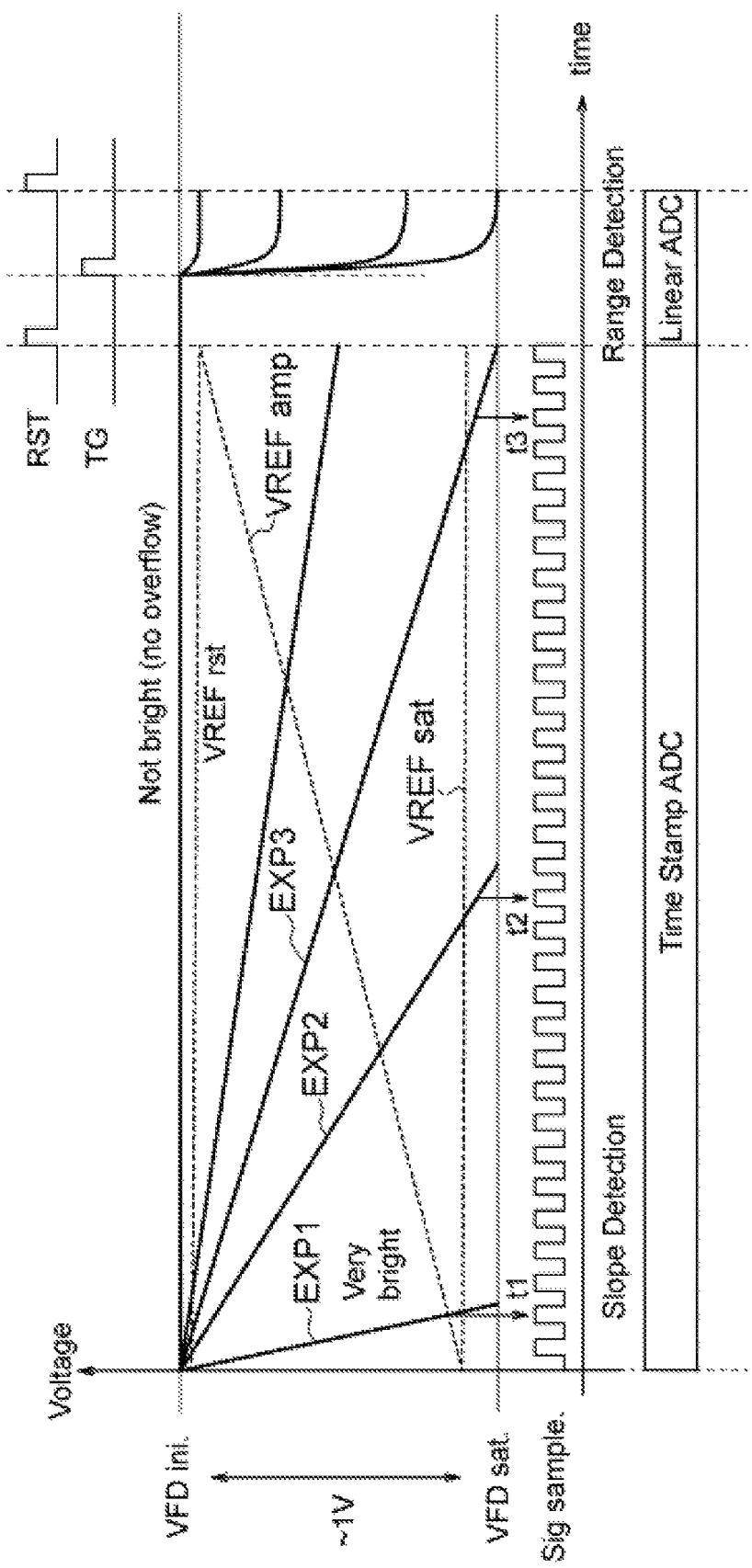
FIG. 5 is used to illustrate a first comparing operation performed by a comparator relating to the first embodiment of the present invention.

The following describes in more detail the first comparing operation CMPR1. FIG. 5 is used to illustrate the first comparing operation CMPR1 performed by the comparator 221 relating to the first embodiment of the present invention. In FIG. 5, the horizontal axis represents the time and the vertical axis represents the voltage level VFD of the floating diffusion FD1, which is an output node.

As for the voltage level VFD of the floating diffusion FD1, the smallest amount of charges and the highest voltage level VFDini can be observed when the floating diffusion FD1 is at the reset level. On the other hand, a large amount of charges and a low voltage level VFDsat are observed when the floating diffusion FD1 is saturated. Considering these, the referential voltage VREF1 for the comparator 221 is set to voltage VREFsat, which is a fixed level observed at the timing of non-saturation before the saturation is reached, or set to ramp voltage VREFramp, which varies from the voltage level VREFrst at the timing of resetting to the voltage level VREFsat.

If the referential voltage VREF1 is set to the level VREFsat or VREFramp during the first comparing operation CMPR1, the time required to flip (invert) the output of the comparator 221 decreases as the intensity of the incident light or illuminance increases as shown in FIG. 5. This is because the amount of charges increases as the intensity of the incident light or illuminance increases. In an example case EXP1 where the illuminance is of the highest level, the output of the comparator 221 is flipped (inverted) immediately at a timing t1. In an example case EXP2 where the illuminance is lower than in the example case EXP1, the output of the comparator 221 is flipped (inverted) at a timing t2 later than the timing t1. In an example case EXP3 where the illuminance is lower than in the example case EXP2, the output of the comparator 221 is flipped (inverted) at a timing t3 later than the timing t2.

As described above, as a result of the first comparing operation CMPR1, the comparator 221 outputs the first comparison result signal SCMP1 corresponding to the time determined by the amount of the overflow charges from the photodiode PD1 to the floating diffusion FD1 in a predetermined period of time within the storing period PI.

To be more specific, in the first comparing operation CMPR1, the comparator 221 is capable of comparing the light level against the referential voltage as long as the light level produces the signal level ranging (i) from the signal level corresponding to a predetermined threshold value of the photodiode PD1 obtained with a maximum value of the sampling time that is required to cause the overflow charges to start overflowing from the photodiode PD1 to the floating diffusion FD1, which is an output node, (ii) to the signal level obtained with a minimum value of the sampling time.

As described above, the photo conversion operation in the time stamp ADC mode involves light to time conversion and is performed in the storing period PI. As shown in FIG. 5, in the case of very bright light, the output of the comparator 221 is flipped immediately after the reset activation period, and this light level corresponds to a saturation signal (a well capacity) described as the following equation.

((FD Saturation Amount×Storing Time)/Sampling Period)+PD Saturation Amount

For example, a case is assumed where the FD saturation amount is 8 Ke– at 150 uV/e– (the FD capacitance of 1.1 fF), the minimum sampling time is 15 nsec, and the storing time is 3 msec.

This time stamp ADC operation mode is, as described above, capable of comparing the light level against the reference level as long as the light level produces the signal level ranging (i) from the signal level corresponding to a predetermined threshold value of the photodiode PD1 obtained with a maximum value of the sampling time that is required to cause the overflow charges to start overflowing from the photodiode PD1 to the floating diffusion FD1, which is an output node, (ii) to the signal level obtained with a minimum value of the sampling time.

Figure 6:
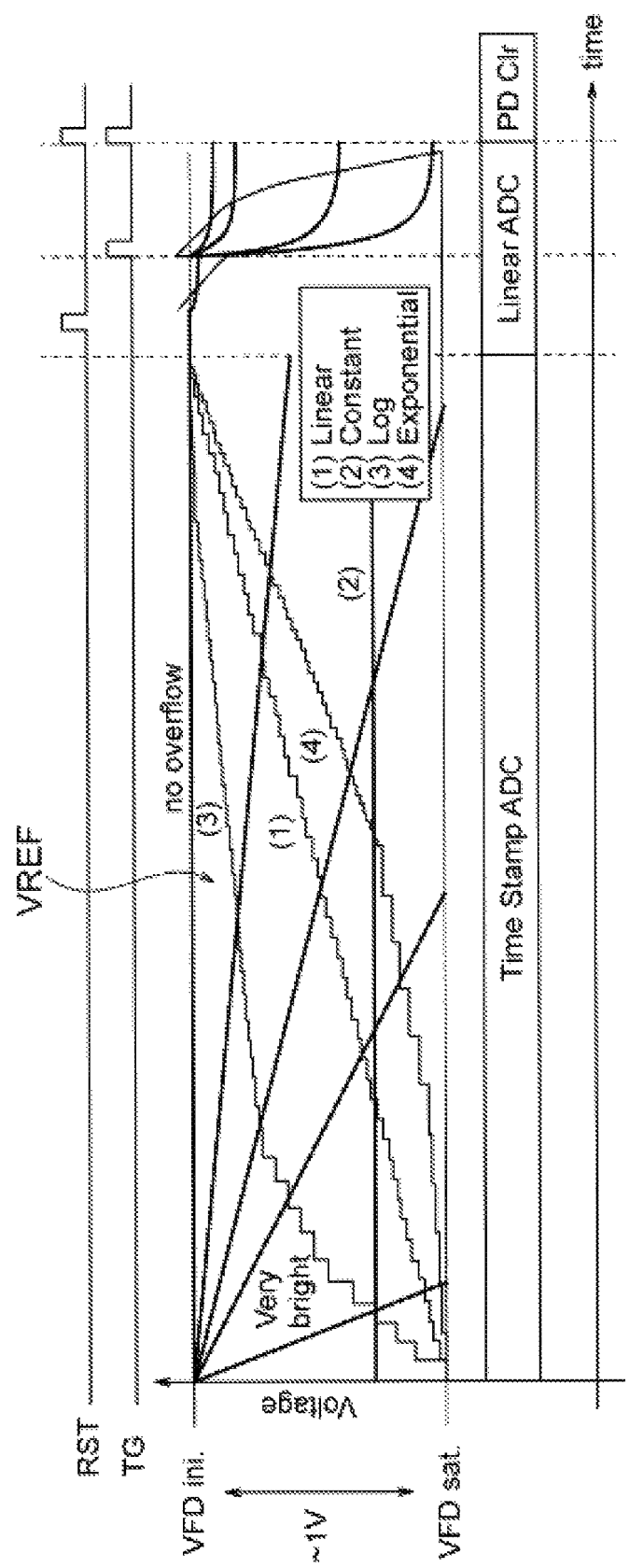
FIG. 6 is used to illustrate the first comparing operation performed by the comparator relating to the first embodiment and shows other examples of the pattern of a referential voltage.

FIG. 6 is used to illustrate the first comparing operation CMPR1 performed by the comparator 221 relating to the first embodiment and shows other examples of the pattern of the referential voltage.

The referential voltage VREF may be a voltage signal having a ramp waveform (signal) RAMP that varies with a predetermined gradient indicated by the number (1) in FIG. 6, a voltage signal having a fixed voltage DC indicated by the number (2) in FIG. 6, a log voltage signal indicated by the number (3) in FIG. 6 or an exponential voltage signal indicated by the number (4) in FIG. 6.

Figure 7:
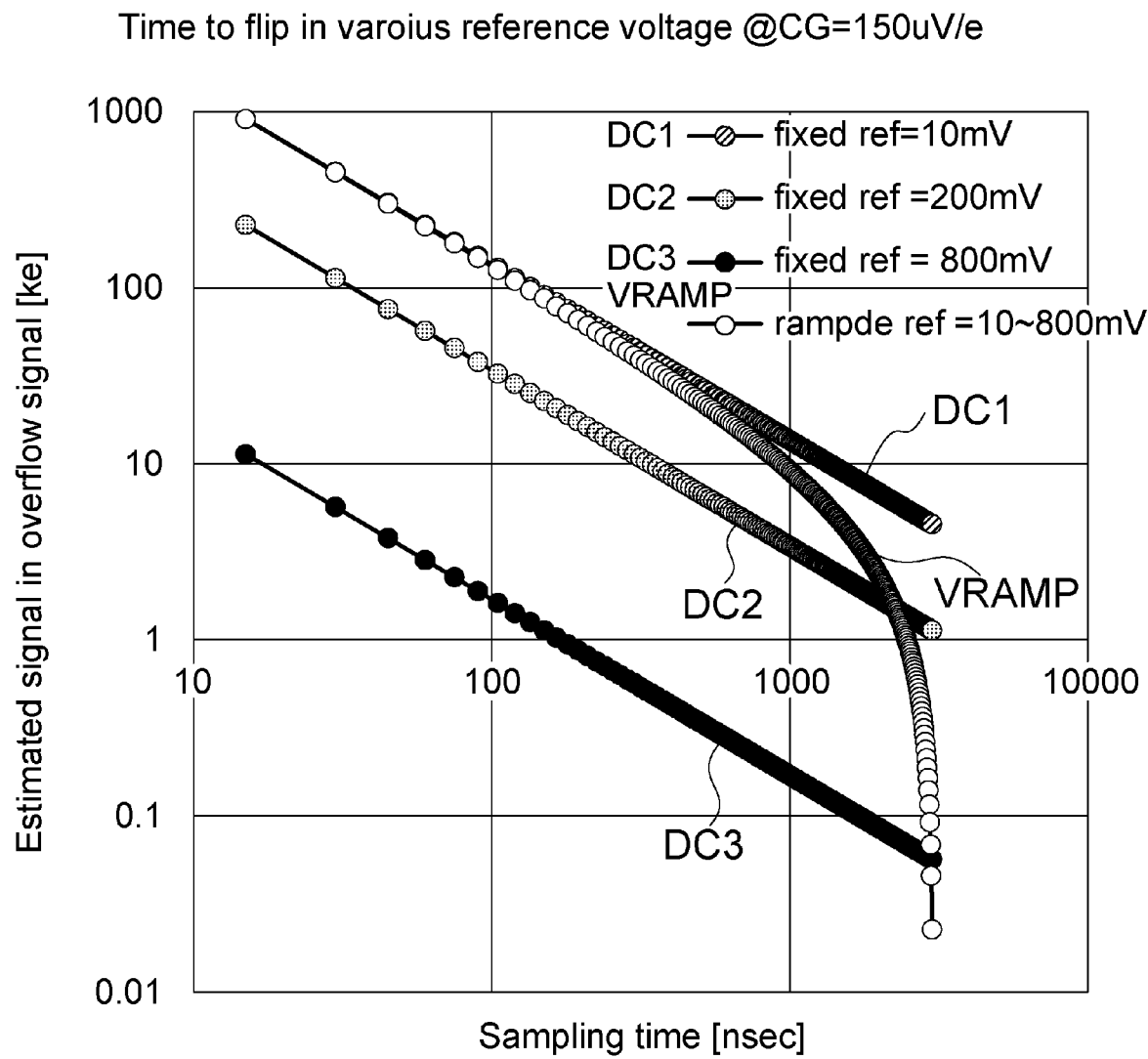
FIG. 7 shows the result of the light to time conversion when the referential voltage input into the comparator relating to the first embodiment is varied in level.

FIG. 7 shows the result of the light to time conversion when the referential voltage VREF input into the comparator relating to the first embodiment is varied in level. In FIG. 7, the horizontal axis represents the sampling time, and the vertical axis represents the estimated signal in the overflow signal.

FIG. 7 shows a sampling time required to flip the output of the comparator 221 corresponding to the overflow charges (signal) for different natures (properties) of the applied light. FIG. 7 shows the sampling time required to flip for various fixed reference voltage levels DC1, DC2, DC3 and a ramp reference voltage VRAMP. In this example, a linear reference ramp is used.

On completion of the above-described time stamp ADC mode operation in which the first comparing operation CMPR1 for the saturated overflow charges is performed, the floating diffusion FD1 and the comparator 221 are reset, and the linear ADC mode subsequently starts, in which the second comparing operation CMPR2 for the non-saturated charges is performed.

Figure 8:
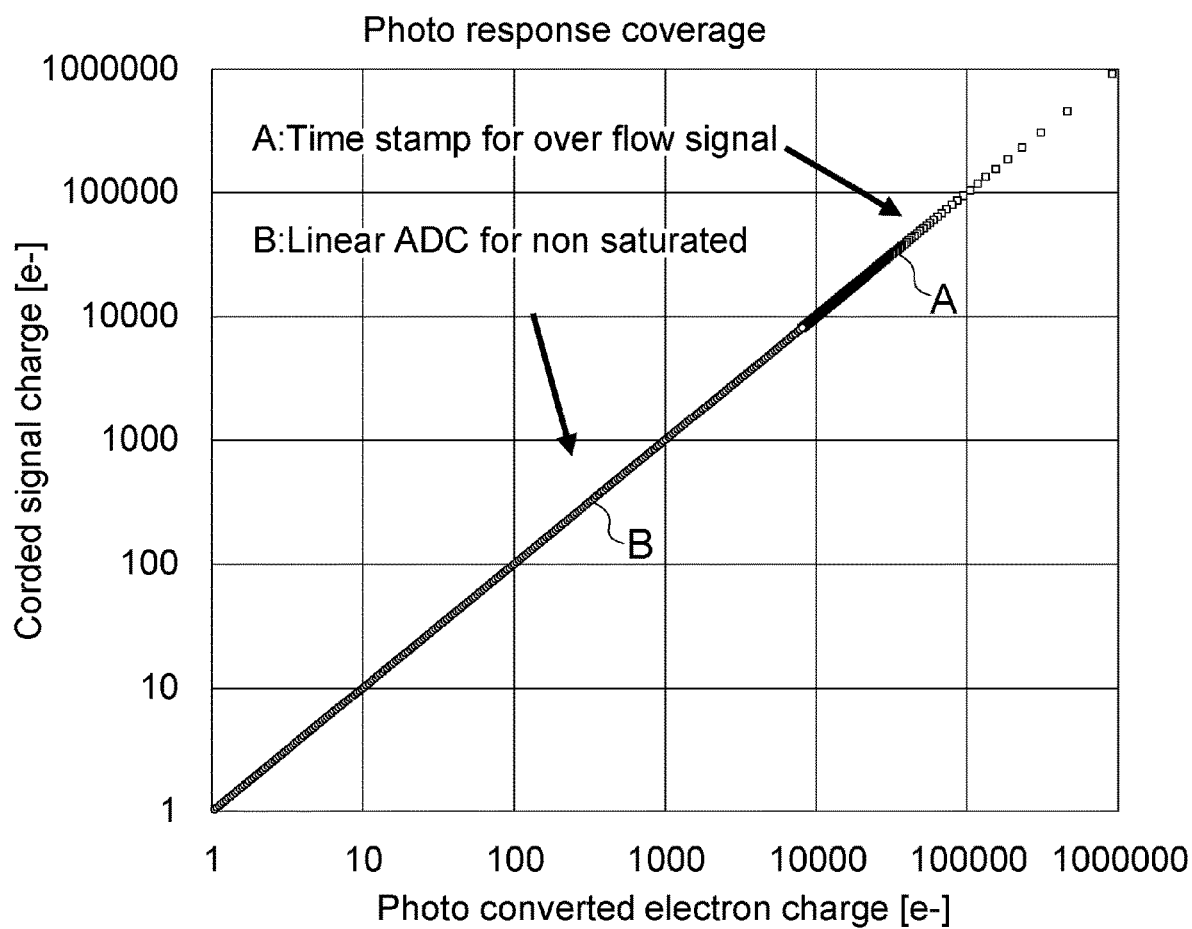
FIG. 8 shows photo response coverages in the digital pixel relating to the first embodiment of the present invention.

FIG. 8 shows photo response coverages in the digital pixel relating to the first embodiment of the present invention. In FIG. 8, "A" represents the signal obtained in the time stamp ADC mode operation and "B" represents the signal obtained in the linear ADC mode.

The time stamp ADC mode can provide photo response for very bright light, and the linear ADC mode can provide photo response for dark light. For example, a dynamic range of 120 dB can be realized. For example, the saturation signal within the photo conversion range has 900 Ke, as described above. Since the linear ADC mode involves a normal reading operation employing ADC, the linear ADC mode can cover the range from 2e or the noise level to 8Ke where the photodiode PD1 and the floating diffusion FD1 are saturated. The coverage provided by the linear ADC mode can be increased to 30 Ke by adding a switch and a capacitor.

<Configuration of Memory Part>

The memory part 230 is formed using an SRAM 231 serving as an ADC memory, and an ADC code is written into and read from the memory part 230 under control of the reading part 60. In the SRAM 231 relating to the present embodiment, a power gating transistor is additionally provided to both of the power supply node (between the power supply and the virtual power supply node) and the ground node (between the virtual reference potential node and the reference potential) for the purposes of blocking the shoot-through currents from the bit cells during the writing operation. The power gating transistors are controlled by the reading part 60 so as to operate as either a weak current source or switch.

In the present embodiment, the reading part 60, more specifically, the vertical scanning circuit 30 includes a supporting circuit for controlling the gate voltage of the power gating transistors such that they operate as a weak current source during an AD conversion period in which AD conversion is performed and the resulting ADC code is written and controlling the gate voltage of the power gating transistors such that they operate as a switch during a reading period following the AD conversion period.

Figure 9:
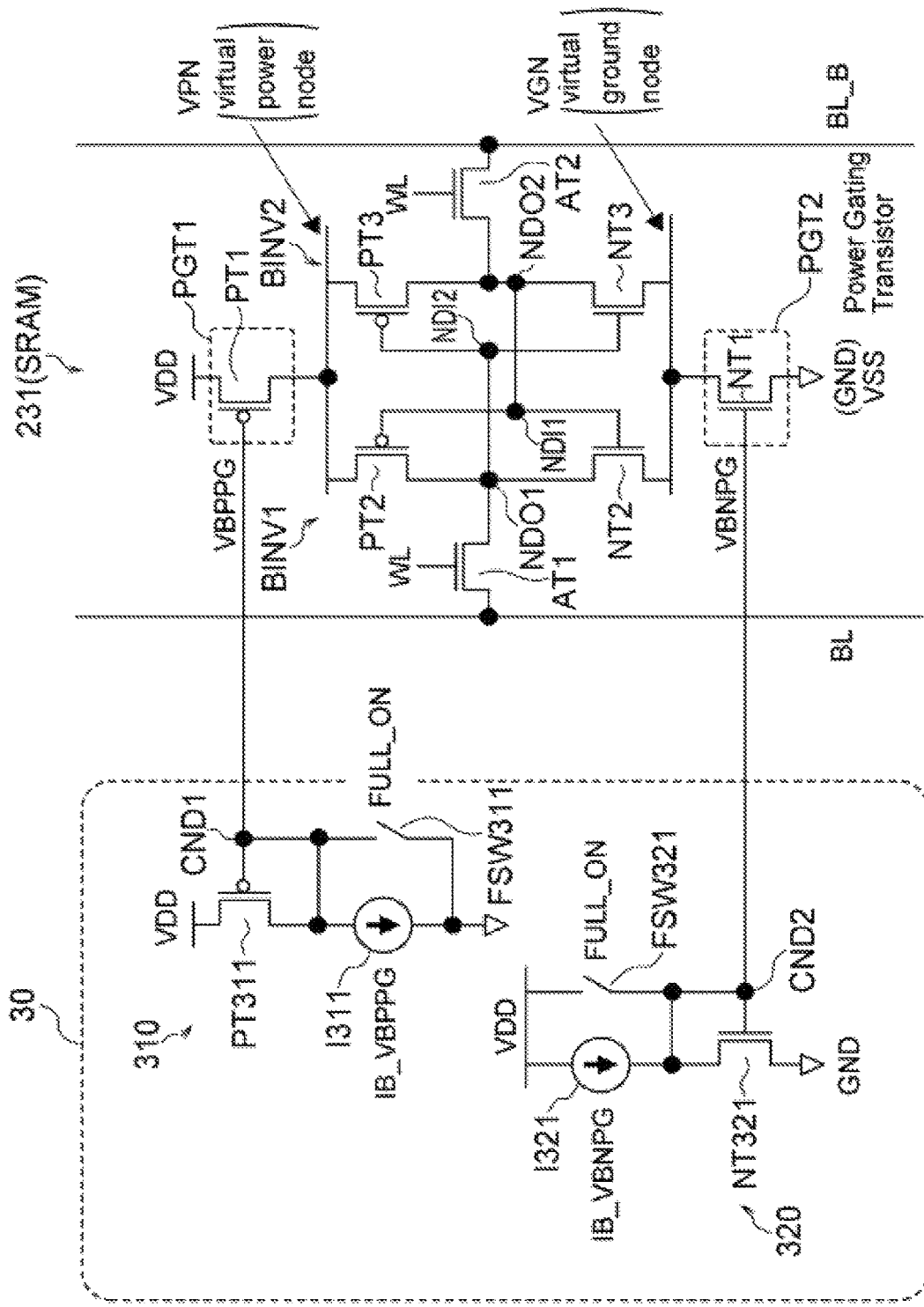
FIG. 9 is a circuit diagram showing an example configuration of an SRAM serving as an ADC memory and supporting circuits relating to the first embodiment of the present invention.

FIG. 9 is a circuit diagram showing an example configuration of an SRAM serving as the ADC memory and the supporting circuits relating to the first embodiment of the present invention.

The SRAM 231 includes a first bit line BL and a second bit line BL_B, a power supply potential VDD, a reference potential VSS (for example, the ground GND), a virtual power supply node VPN, and a virtual reference potential node (hereinafter, may be referred to as the virtual ground node) VGN. The SRAM 231 includes a first first-conductivity-type (in the present embodiment, p-channel) transistor (first PMOS transistor) PT1 and a first second-conductivity-type (in the present embodiment, n-channel) transistor (first NMOS transistor) NT1. The first PMOS transistor PT1 is connected between the power supply potential VDD and the virtual power supply node VPN and serves as a power-supply-side power gating transistor PGT1, and the first NMOS transistor NT1 is connected between the reference potential VSS and the virtual reference potential node VGN and serves as a reference-potential-side (ground-side) power gating transistor PGT2.

The SRAM 231 further includes a first back-to-back inverter BINV1, a second back-to-back inverter BINV2, a first access transistor AT1 and a second access transistor AT2.

The first back-to-back inverter BINV1 includes a second first-conductivity-type transistor (second PMOS transistor) PT2 having a source connected to the virtual power supply node VPN and a second second-conductivity-type transistor (second NMOS transistor) NT2 having a source connected to the virtual ground (reference potential) node VGN. The gate of the PMOS transistor PT2 serving as the second first-conductivity-type transistor is connected to the gate of the NMOS transistor NT2 serving as the second second-conductivity-type transistor to form a first input node NDI1, and their drains are connected to form a first output node NDO1.

The second back-to-back inverter BINV2 includes a third first-conductivity-type transistor (third PMOS transistor) PT3 having a source connected to the virtual power supply node VPN and a third second-conductivity-type transistor (third NMOS transistor) NT3 having a source connected to the virtual ground (reference potential) node VGN. The gate of the PMOS transistor PT3 serving as the third first-conductivity-type transistor is connected to the gate of the NMOS transistor NT3 serving as the third second-conductivity-type transistor to form a second input node NDI2, and their drains are connected to form a second output node NDO2. The first input node NDI1 is connected to the second output node NDO2, and the second input node NDI2 is connected to the first output node NDO1.

The first access transistor AT1 is formed using an NMOS transistor, the source and drain are connected between the first output node NDO1 and the first bit line BL, and the gate is connected to the word line WL. The second access transistor AT2 is formed using an NMOS transistor, the source and drain are connected between the second output node NDO2 and the second bit line BL_B, and the gate is connected to the word line WL.

The reading part 60 controls the gate voltage VBPPG of the first first-conductivity-type (in the present embodiment, p-channel) transistor (first PMOS transistor) PT1 serving as the power-supply-side power gating transistor PGT1 and the gate voltage VPNPG of the first second-conductivity-type (in the present embodiment, n channel) transistor (first NMOS transistor) NT1 serving as the reference-potential-side (ground-side) power gating transistor PGT2 such that the transistors can operate either as a weak current source or switch.

The reading part 60 controls the gate voltage VBPPG of the first PMOS transistor PT1 serving as the power-supply-side power gating transistor PGT1 and the gate voltage VPNPG of the first NMOS transistor NT1 serving as the reference-potential-side (ground-side) power gating transistor PGT2 such that they operate as a weak current source in an AD conversion period in which AD conversion is performed and an ADC code is written. The reading part 60 controls the gate voltage VBPPG of the first PMOS transistor PT1 serving as the power-supply-side power gating transistor PGT1 and the gate voltage VPNPG of the first NMOS transistor NT1 serving as the reference-potential-side (ground-side) power gating transistor PGT2 such that they operate as a switch in a reading period following the AD conversion period.

The vertical driving circuit 30 constituting the reading part 60 includes a first supporting circuit 310 for controlling the gate voltage VBPPG of the first PMOS transistor PT1 serving as the power-supply-side power gating transistor PGT1 and a second supporting circuit 320 for controlling the gate voltage VPNPG of the first NMOS transistor NT1 serving as the reference-potential-side (ground-side) power gating transistor PGT2.

The first supporting circuit 310 includes a first control node CND1 connected to the gate of the first PMOS transistor PT1 of the SRAM 231, a PMOS transistor PT311 connected at the source thereof to the power supply potential VDD and at the gate and drain thereof to the first control node CND1 and serving as a current mirror first-conductivity-type transistor, a first current source 1311 connected between the drain of the current mirror PMOS transistor PT311 and the reference potential VSS, and a first full switch FSW311 connected between the first control node CND1 and the reference potential VSS.

The second supporting circuit 320 includes a second control node CND2 connected to the gate of the first NMOS transistor NT1 of the SRAM 231, an NMOS transistor NT321 connected at the source thereof to the reference potential VSS and at the gate and drain thereof to the second control node CND2 and serving as a current mirror second-conductivity-type transistor, a second current source 1321 connected between the drain of the current mirror NMOS transistor NT321 and the power supply potential VDD, and a second full switch FSW 321 connected between the second control node CND2 and the power supply potential VDD.

In the AD conversion period, the reading part 60 uses the first supporting circuit 310 and the second supporting circuit 320 to keep the first full switch FSW311 and the second full switch FSW321 in the non-conduction state, so that the gate voltage VBPPG of the first PMOS transistor PR1 serving as the power-supply-side power gating transistor PGT1 and the gate voltage VPNPG of the first NMOS transistor NT1 serving as the reference-potential-side (ground-side) power gating transistor PGT2 transition to their respective target bias voltage levels Target VBPPG and Target VPNPG in order to effectuate the weak current source mode. In the reading period, the reading part 60 uses the first supporting circuit 310 and the second supporting circuit 320 to keep the first full switch FSW311 and the second full switch FSW321 in the conduction state, so that the gate voltage of the first PMOS transistor PT1 transitions to the reference potential level (the GND level) in order to cause the virtual power supply node VPN to operate as a power supply line and the gate voltage of the first NMOS transistor NT1 transitions to the power supply voltage level (the VDD level) in order to cause the virtual reference potential node VGN to operate as the reference potential VSS (GND).

According to the above-described circuit configurations and driving technologies, all of the SRAM bit cells in the pixel cell array can operate concurrently as a global-shutter pixel cell digital memory in the AD conversion period and do not allow the leakage currents to destroy the saved image data once the ADC code is written. In this way, the AD conversion is accomplished successfully. With such a configuration, the SRAM bit cells can be used in digital pixels.

Having the above-described configuration for the SRAM 231 of the memory part 230, the solid-state imaging device 10 relating to the present embodiment is capable of effectively blocking the shoot-through currents from the SRAM bit cells while writing is performed on the bit cells and achieving excellent writing operations.

The following examines how the above-described configuration for the SRAM 231 of the memory part 230 permits the solid-state imaging device 10 relating to the present embodiment to effectively block the shoot-through currents from the SRAM bit cells while writing is performed on the bit cells, in comparison with how a writing operation is performed in a normal SRAM having no power gating transistors.

<Writing Operation Performed in Normal SRAM>

Figure 10A:
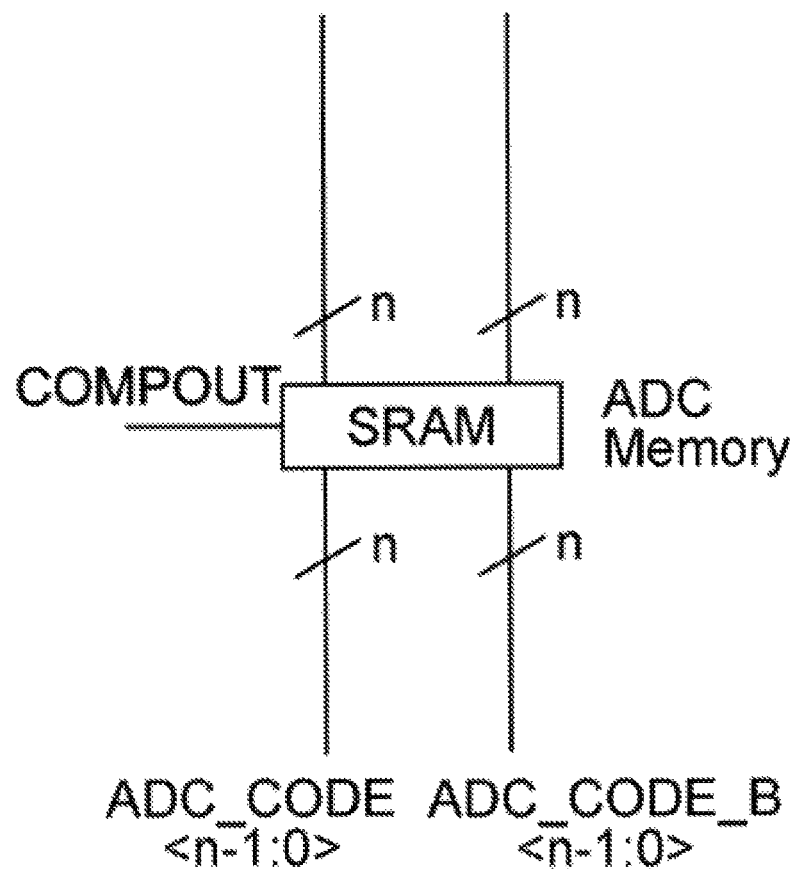
FIGS. 10A to 10C show an example of a normal SRAM bit cell serving as an ADC code memory.
Figure 10B:
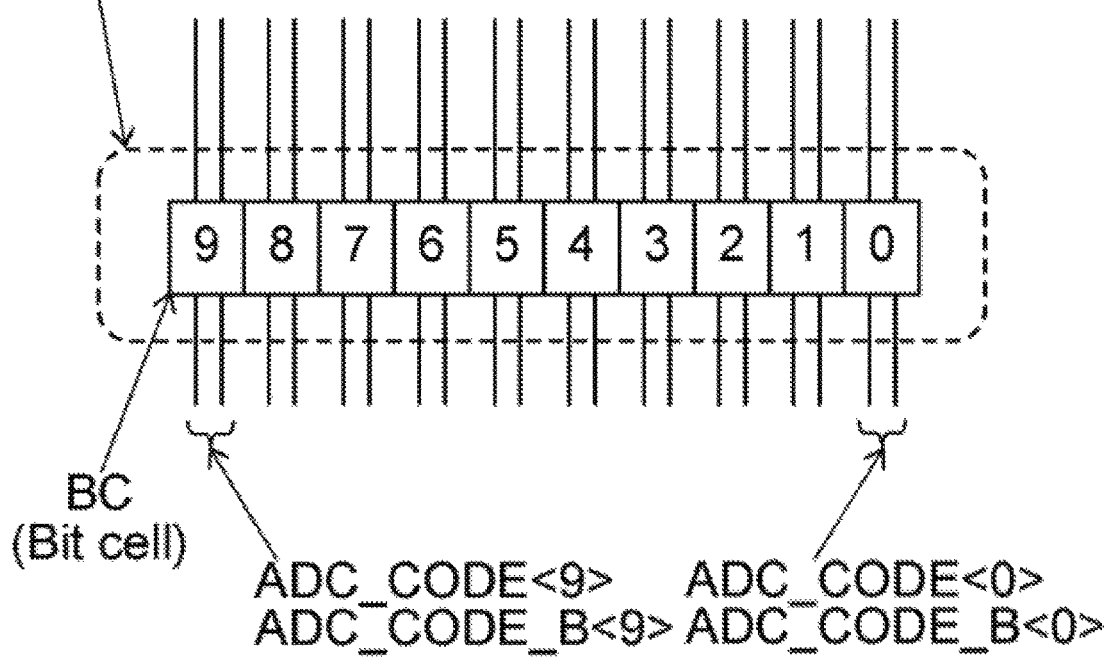
Figure 10C:
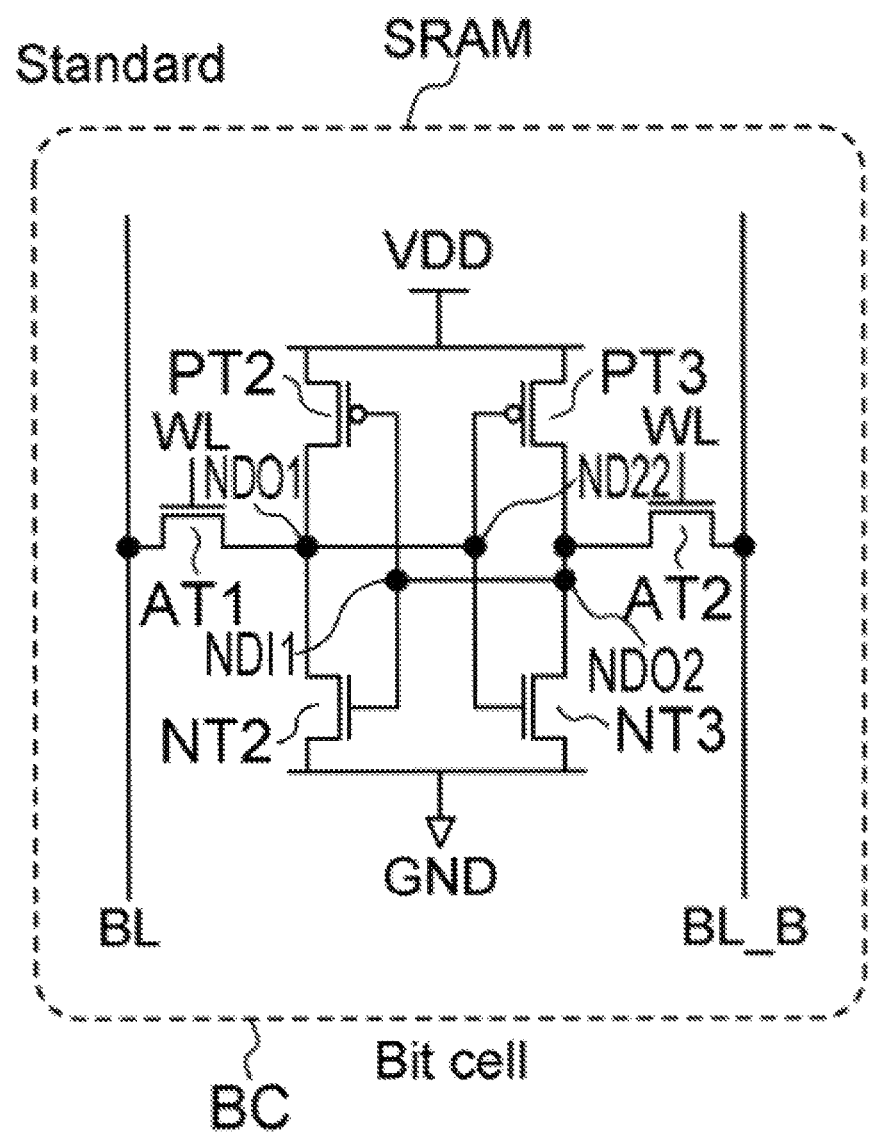
Figure 11A:
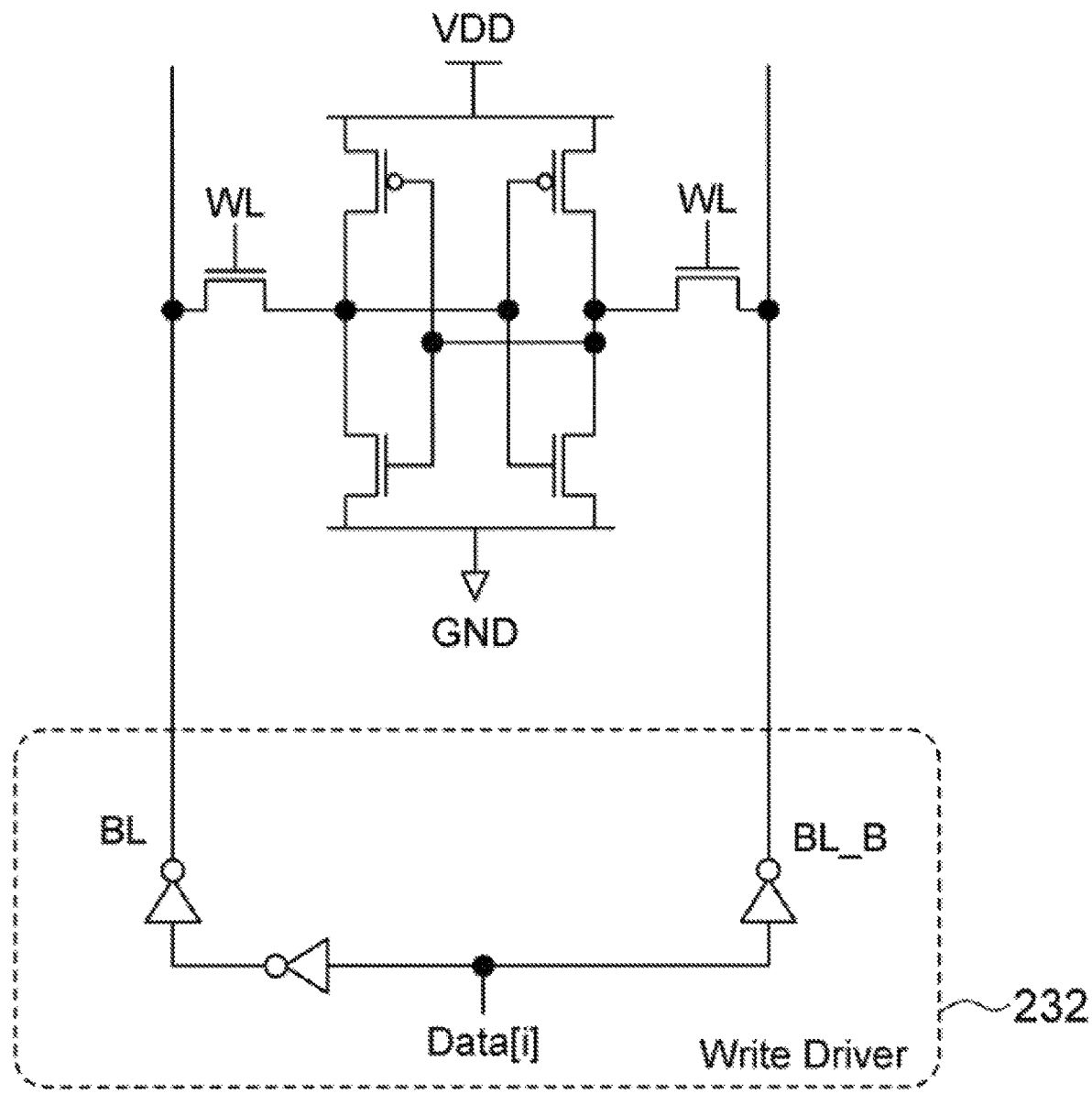
FIGS. 11A and 11B show a first problem of a normal SRAM bit cell.
Figure 11B:
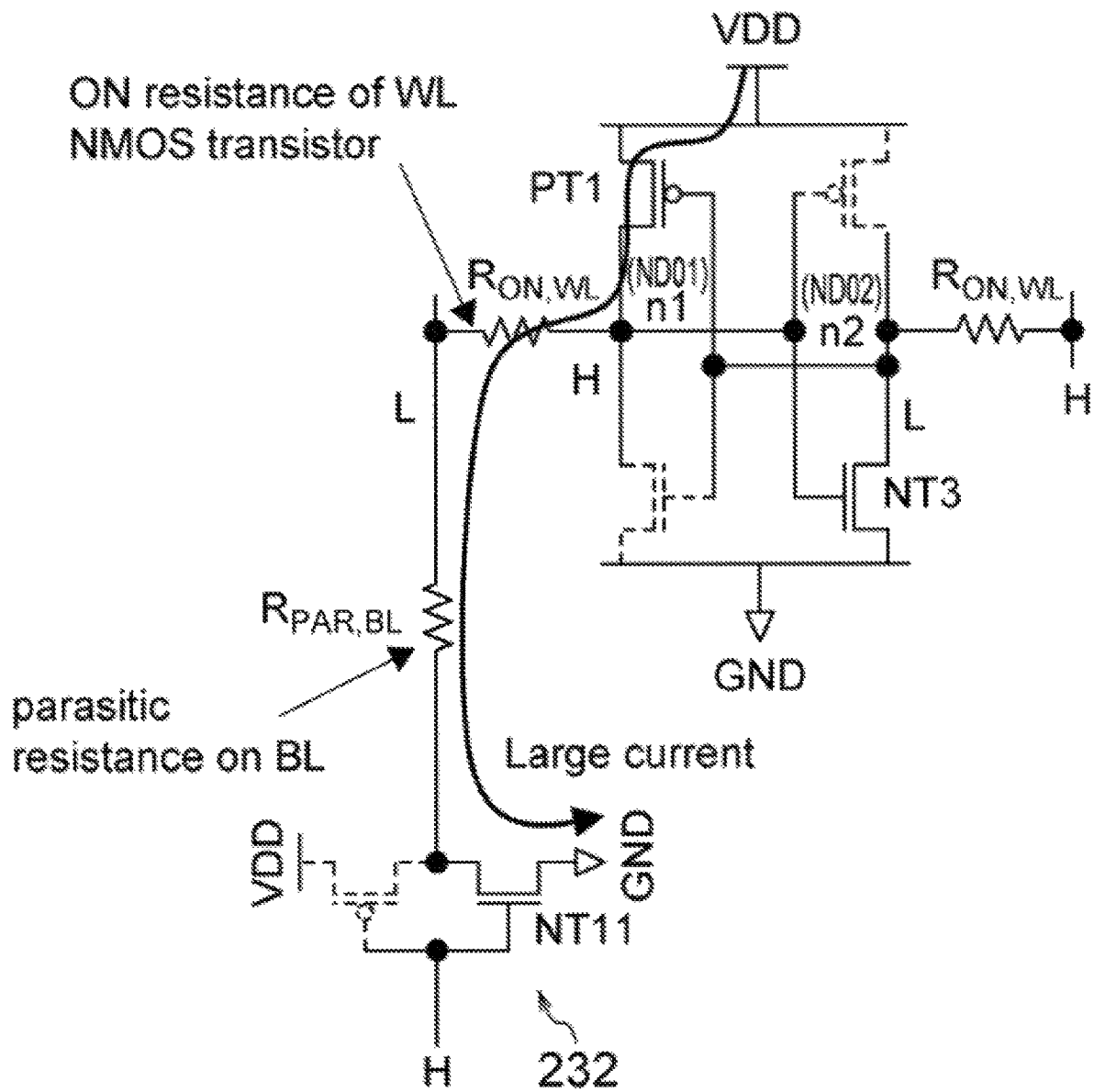
Figure 12:
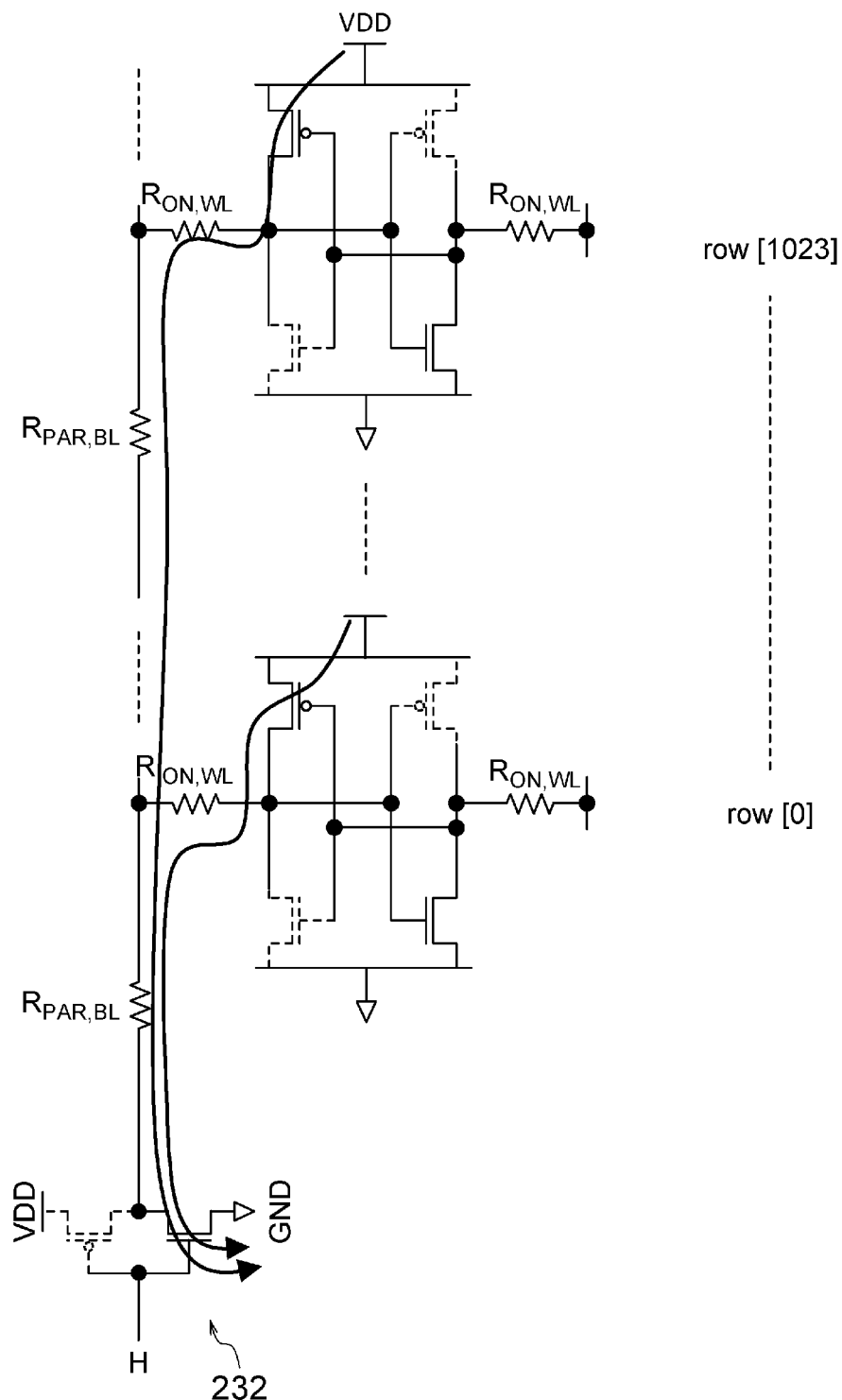
FIG. 12 shows a second problem of a normal SRAM bit cell.

FIGS. 10A to 10C show an example of a normal SRAM bit cell serving as an ADC code memory. FIGS. 11A and 11B are used to illustrate a first problem of the normal SRAM bit cell. FIG. 12 is used to illustrate a second problem of the normal SRAM bit cell.

As shown in FIGS. 10A to 10C, the ADC memory is constituted by an SRAM bit cell, and reading and writing operations are performed on the ADC memory using both an ADC_CODE and its inverted signal (ADC_CODE_B) fed to the ADC memory. FIGS. 10A to 10C show a 10-bit ADC memory. A normal SRAM bit cell uses 6 standard transistors, as shown in FIG. 10C.

Here, a case is assumed where the SRAM bit cell keeps the high level (H) at the node n1 (equivalent to the first output node NDO1) as shown in FIG. 11B. In this case, the PMOS transistor PT1 and the NMOS transistor NT3 of the SRAM are both in the on state. When the writing driver 232 drives the first bit line BL with the low level (L), the NMOS transistor NT11 of the writing driver 232 is in the on state, so that the GND potential is connected to the first bit line BL and to the input of the SRAM bit cell.

Since the SRAM is constituted by a pair of positive feedback inverters, the writing driver 232 is required to inject a large amount of charges. Therefore, currents are fed through the node n1 to place the node back to the low level. This step generates large shoot-through currents (the DC currents from PT1 to NT11). As a consequence, the writing operation for the normal SRAM requires great power consumption.

In the digital pixel array, all of the pixels are active during the AD conversion period. This means that writing is performed in all of the SRAM bit cells in the manner shown in FIG. 12. Here, a case is assumed where the pixels are arranged in 1024 columns×1024 rows. In this case, 1024 SRAM bit cells are connected to the bit line BL. It is also assumed that the power consumption in each bit cell reaches approximately 100 µA at the peak, which occurs while what is saved in the memory is being restored.

In this case, the total currents that need to be fed by the writing driver 232 amounts to approximately 100 mA (=100 µA×1024), and the writing driver 232 requires a very large transistor therein. If the parasitic resistance RPAR, BL on the bit line is for example, 3.5 ohm/row, the total resistance reaches approximately 3.5 kilo-ohms. Accordingly, the IR drop significantly impedes the propagation of the ADC code on the bit line. For example, the parasitic resistance on the bit line BL is approximately 14 ohms in the case of four rows, and a current of 100 mA flows through the 14-ohm resistance, which causes an IR drop of 1.4 V. This is typically higher than the power supply voltage of 1.2 V for the SRAM. The above-described scenario means that the SRAM memory can only have SRAM bit cells of less than four rows. The rest of the bit cells may not operate properly or may operate but at very low speed.

To address this issue, in the SRAM 231 relating to the present embodiment, power gating transistors PGT1, PGT2 are additionally provided to the power supply node (between the power supply and the virtual power supply node) and the ground node (between the virtual reference potential node and the reference potential) for the purposes of blocking the shoot-through currents from the bit cells during the writing operation. The power gating transistors are controlled through the first supporting circuit 310 and the second supporting circuit 320 of the reading part 60 so as to operate as either a weak current source or switch.

The SRAM 231 relating to the present embodiment significantly reduces the currents from the bit cells on which writing is being performed, by blocking the route originating from the power supply. Therefore, it is expected that the present embodiment can significantly reduce the IR drop. As a result, the writing does not fail and can be performed on the SRAM at high speed. The blocking can be accomplished by causing the power gating transistors to operate as a weak current source. In this case, the output resistance of the PMOS transistor PT1 serving as the first power gating transistor PGT1 increases very much, and the currents from the power supply potential VDD are precisely limited. A weak current source can be realized using a current mirror. The current is set such that what is saved in the bit cell can be maintained even if the word line WL is brought to the low level (OFF). When the word line WL is at the low level (off), the leakage current within the bit cell causes a change in the node voltage. If the leakage current is smaller than the current fed from the power gating transistor operating as the current source, the bit cell remains in the same state.

Figure 13:
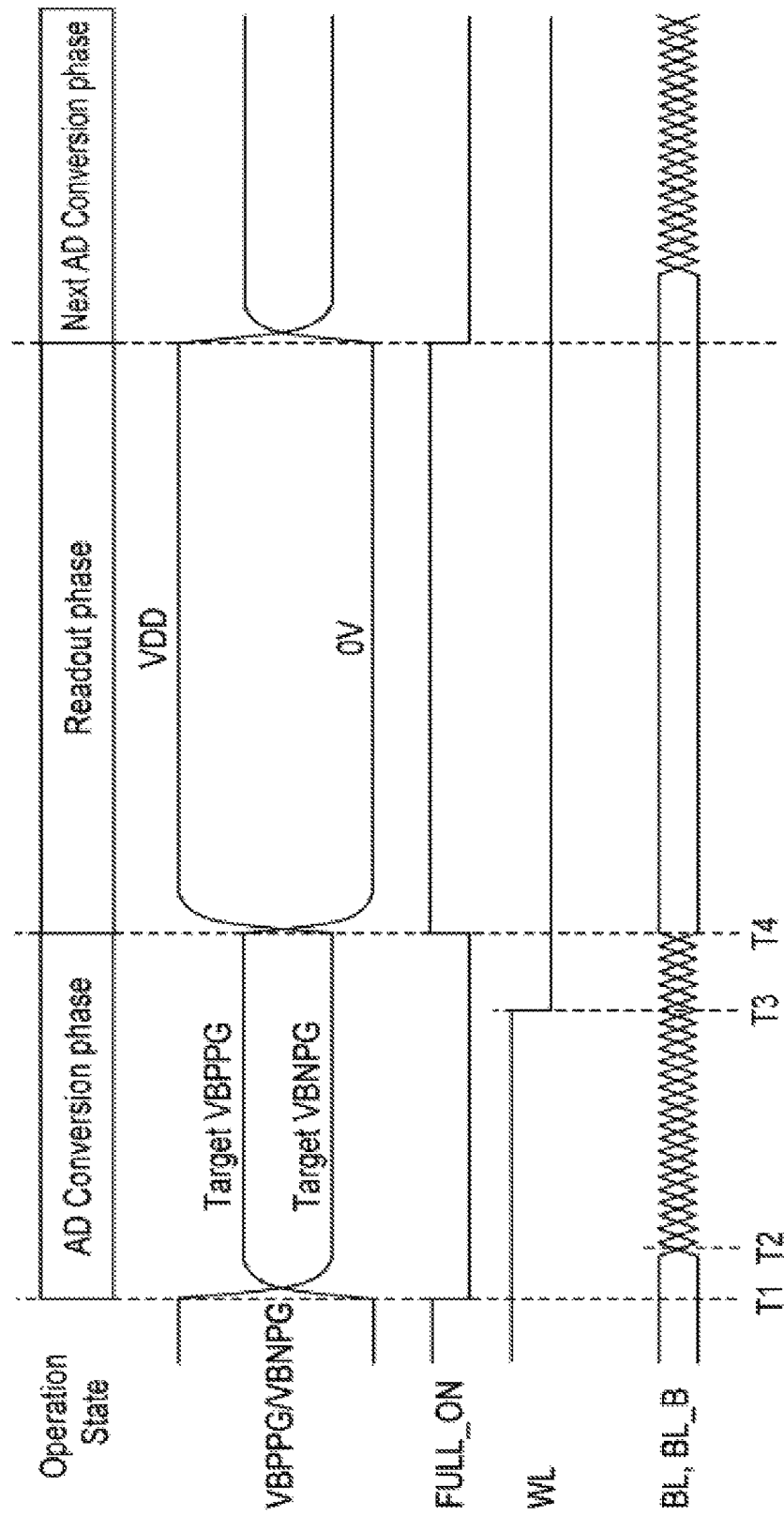
FIG. 13 is used to illustrate how the SRAM relating to the first embodiment of the present invention operates.
Figure 14:
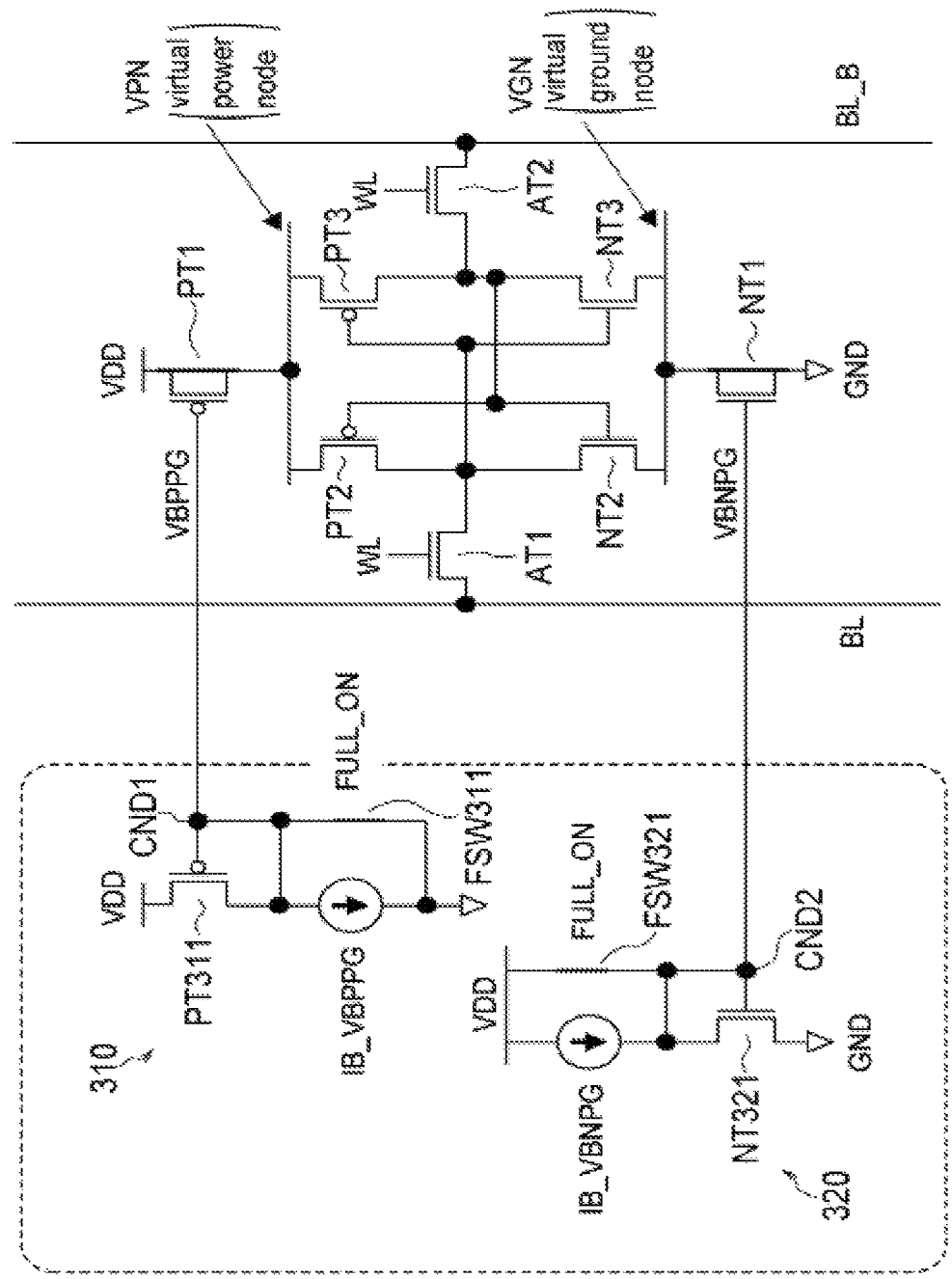
FIG. 14 is used to illustrate how the SRAM relating to the first embodiment of the present invention operates when full switches of a first supporting circuit and a second support circuit are in the on state.

FIG. 13 is used to illustrate how the SRAM relating to the first embodiment of the present invention operates. FIG. 14 is used to illustrate how the SRAM relating to the first embodiment of the present invention operates when the full switches of the first and second supporting circuits are in the on state.

As shown in FIG. 13, the AD conversion period starts at a timing T1. By setting the signal FULL_ON at the low level and turning off the full switches FSW311 and FSW321, the PMOS transistor PT1 serving as the first power gating transistor PGT1 and the NMOS transistor NT1 serving as the second power gating transistor PGT2 enter the weak current source mode. Accordingly, the gate voltage VBPPG of the PMOS transistor PT1 and the gate voltage VBNPG of the NMOS transistor NT1 transition to their respective target bias voltage levels Target VBPPG and Target VBNPG.

At a timing T2, the first bit line BL and the second bit line BL_B are toggled and the ADC code (ADC_CODE) is sent to all of the SRAM bit cells at the ends of the ADC memory array.

At a timing T3, an example of the signal on the word line WL, which is the output from the comparator 221 COMPOUT) is shown.

At a timing T4, the AD conversion period ends and the reading period starts. At this timing, the signal FULL_ON is set at the high level, so that the full switches FSW311, FSW321 are turned on. In this way, the gate voltage VBPPG of the PMOS transistor PT1 serving as the first power gating transistor PGT1 reaches 0 V, and the gate voltage VBNPG of the NMOS transistor NT1 serving as the second power gating transistor PGT2 reaches the power supply potential VDD. As a result, the power gating transistors PGT1, PGT2 are completely and strongly driven to reduce the output impedance, and the written ADC code is kept while the power supply voltage is fed.

When the power gating transistors PGT1, PGT2 are controlled to operate as a weak current source, what is saved in the bit cell is destroyed when reading is performed. This is because sufficient currents cannot be drawn when the access transistors AT1 and AT2 are opened with the word line WL being set at the high level. The bit cell needs to handle the injection of charges from the first bit line BL and the second bit line BL_B, which are precharged to a certain voltage, before the access transistors AT1, AT2 are opened.

For the reading operation, the signal FULL_ON is activated and the power gating transistor PGT1 is strongly or completely turned on to operate as a simple switch. The on resistance of the PMOS transistor PT1 is set very small as if the power gating transistor PGT1 does not exist. Under these circumstances, the virtual power supply node VPN operates in substantially the same manner as the actual power supply line VDD. Therefore, when the access transistors AT1 and AT2 are opened, the PMOS transistor PT1 serving as the power gating transistor PGT1 feeds sufficient currents. In this way, the reading operation is successfully accomplished.

The same applies to the ground-side power gating transistor PGT2, which is controlled together with the power gating transistor PGT1.

The SRAM 231 of the memory part 230 saves, in the form of digital data, the digital first comparison result signal SCMP1 that is obtained as a result of the first comparing operation CMPR1 in the comparator 221 by processing the voltage signal corresponding to the overflow charges in the floating diffusion FD1 and the digital second comparison result signal SCMP2 obtained as a result of the second comparing operation CMPR2 by processing the charges stored in the photodiode PD1, in a correlative manner. As described above, the memory part 230 is formed by an SRAM, receives digital signals fed thereto, is compatible with photo conversion codes, and can be read by an external IO buffer in the output circuit 40 near the pixel array.

Figure 15:
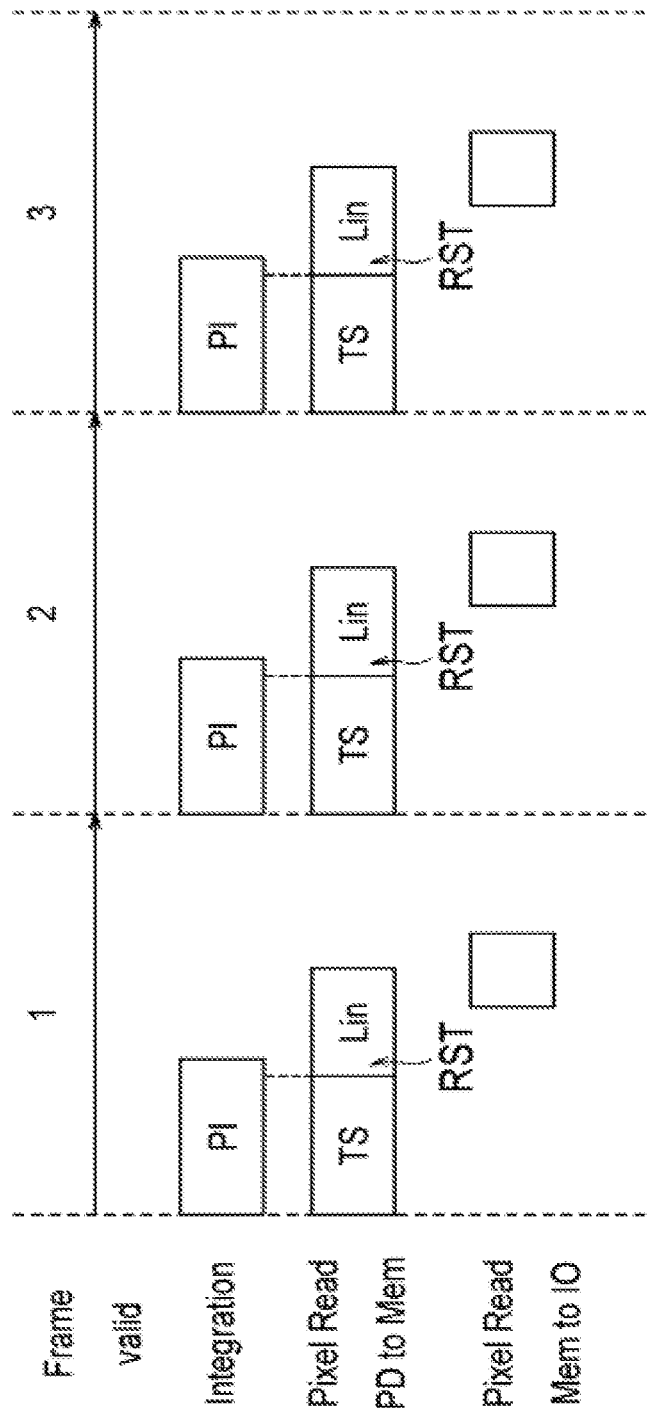
FIG. 15 shows an example sequence of operations performed in a frame reading operation by the solid-state imaging device relating to the first embodiment of the present invention.

FIG. 15 shows an example sequence of operations performed in a frame reading scheme by the solid-state imaging device 10 relating to the first embodiment of the present invention. The following first describes an example of the frame reading scheme in the solid-state imaging device 10. In FIG. 15, TS denotes the period in which the time stamp ADC is performed, and Lin denotes the period in which the linear ADC is performed.

As described above, the overflow charges are stored in the floating diffusion FD1 in the storing period PI. The solid-state imaging device 10 operates in the time stamp ADC mode within the storing period PI. Actually, the solid-state imaging device 10 operates in the time stamp ADC mode within a period that is included in the storing period PI and lasts until the floating diffusion FD1 is reset. On completion of the operations in the time stamp ADC mode, the solid-state imaging device 10 enters to the linear ADC mode, so that the signal (VRST) in the floating diffusion FD1 at the time of resetting is read and converted into a digital signal to be stored in the memory part 230. After the end of the storing period PI, in the linear ADC mode, the signal (VSIG) corresponding to the charges stored in the photodiode PD1 is read and converted into a digital signal to be stored into the memory part 230. The read frame is sent outside of the solid-state imaging device 10 (the image sensor) via the IO buffer of the output circuit 40, which is driven by reading the digital signal data from the memory node and has such an MIPI data format. This operation can be globally performed in the pixel array.

In the pixel part 20, the reset transistor RST1-Tr and the transfer transistor TG1-Tr are used to reset the photodiode PD1 concurrently in all of the pixels, so that exposure to light starts concurrently in parallel in all of the pixels. After a predetermined exposure period (the storing period PI) ends, the transfer transistor TG1-Tr is used to sample the output signal from the photoelectric conversion reading part 210 in the AD converting part 220 and the memory part 230, so that the exposure ends concurrently in parallel in all of the pixels. This successfully accomplish a perfect electronic shutter.

The vertical scanning circuit 30 drives the photoelectric conversion reading part 210 of the digital pixel 200 through row-scanning control lines in shutter and reading rows, under the control of the timing control circuit 50. The vertical scanning circuit 30 includes the first supporting circuit 310 and the second supporting circuit 320 for controlling the gate voltage of the power gating transistors PGT1 and PGT2 of the SRAM 231, as described above. The vertical scanning circuit 30 feeds referential voltage levels VREF1, VREF2 that are set in accordance with the first and second comparing operations CMPR1, CMPR2, to the comparator 221 of each digital pixel 200, under the control of the timing control circuit 50. Further, the vertical scanning circuit 30 outputs, according to an address signal, row selection signals indicating the row addresses of the reading row from which signals are to be read out and the shutter row in which the charges stored in the photodiodes PD are to be reset.

The output circuit 40 includes, an IO buffer 41 arranged in correspondence with the output from the memory in each of the digital pixels 200 in the pixel part 20 and outputs the digital data read from each digital pixel 200 to outside.

The timing control circuit 50 generates timing signals required for signal processing in the pixel part 20, the vertical scanning circuit 30, the output circuit 40, and the like.

In the first embodiment, the reading part 60 controls the reading of the pixel signal from the digital pixel 200 in, for example, the global shutter mode.

<Stacked Structure of Solid-State Imaging Device 10>

The following describes the stacked structure of the solid-state imaging device 10 relating to the first embodiment.

Figure 16A:
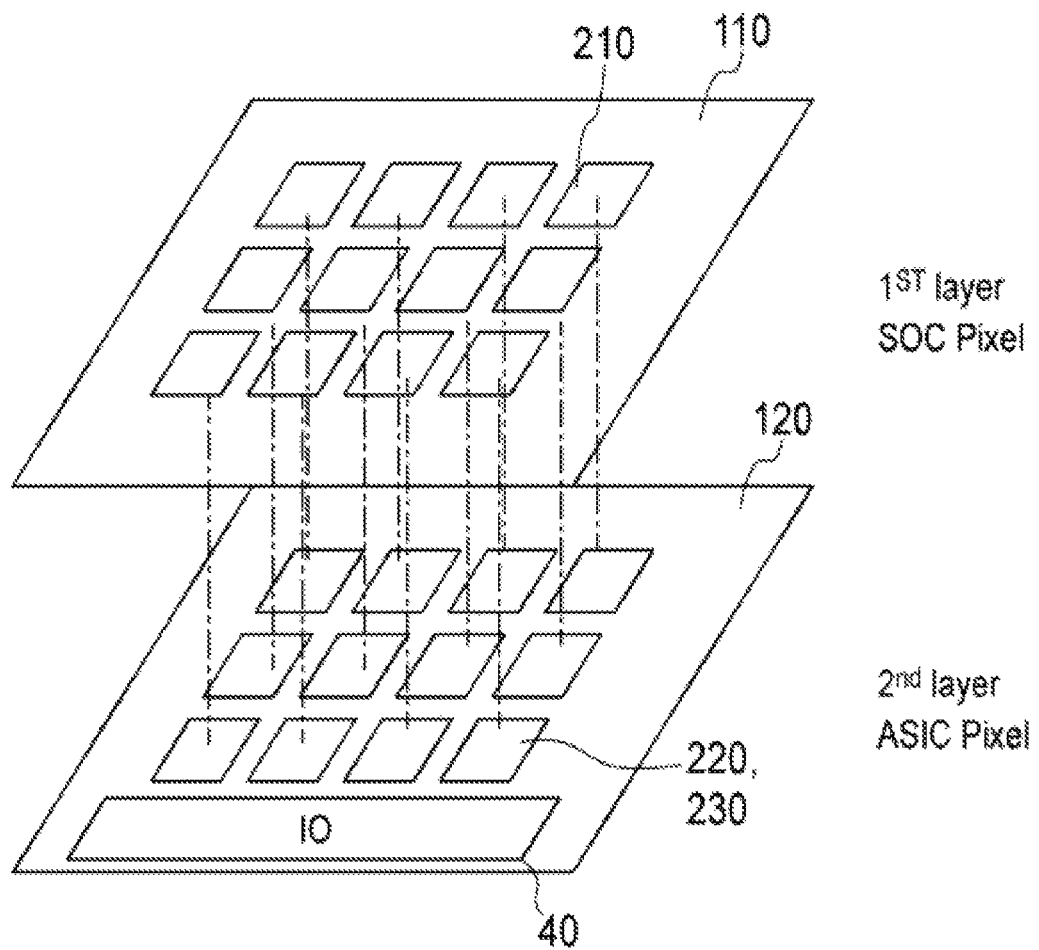
FIGS. 16A and 16B are schematic views to illustrate the stacked structure of the solid-state imaging device relating to the first embodiment.
Figure 16B:
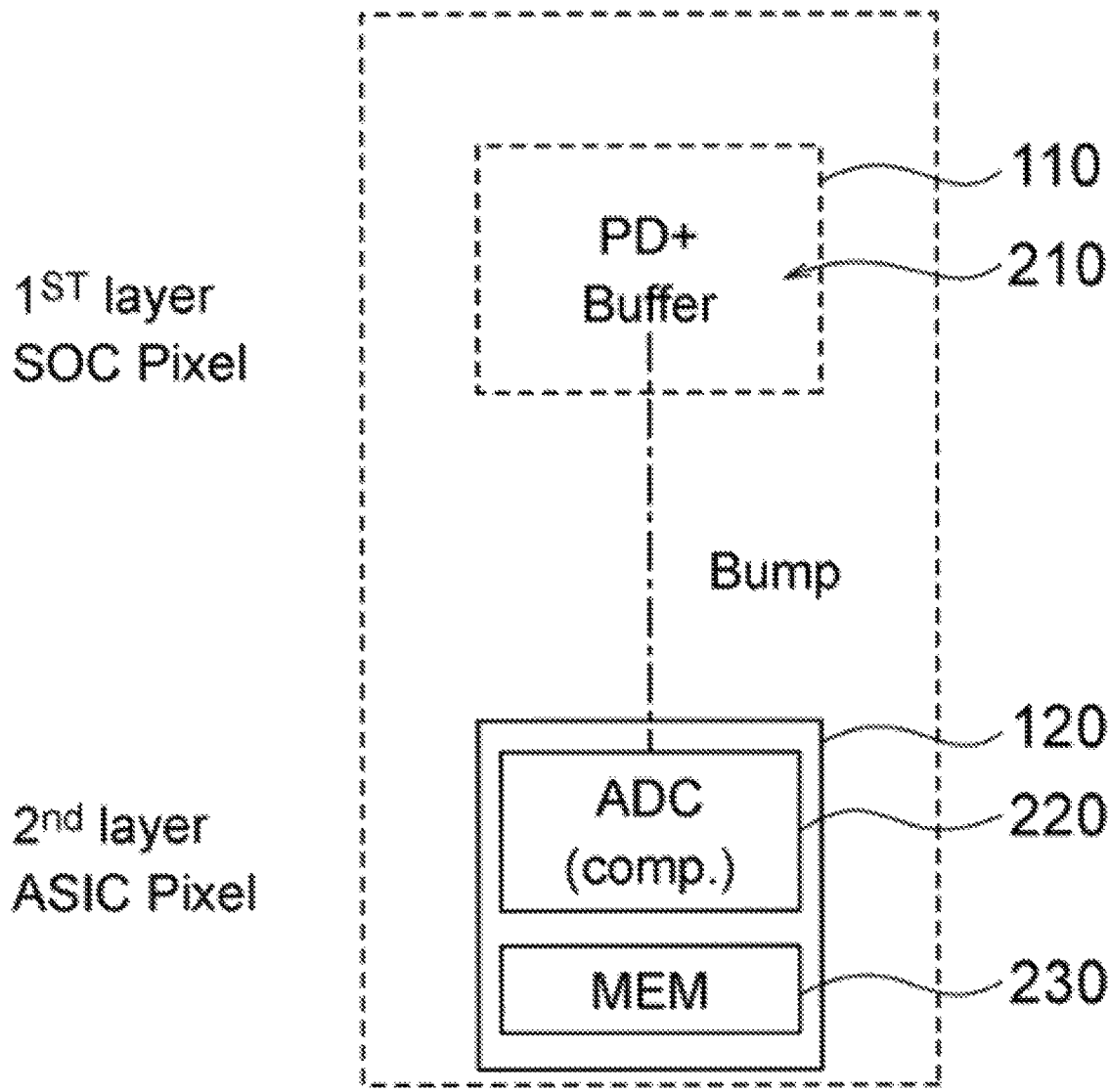
Figure 17:
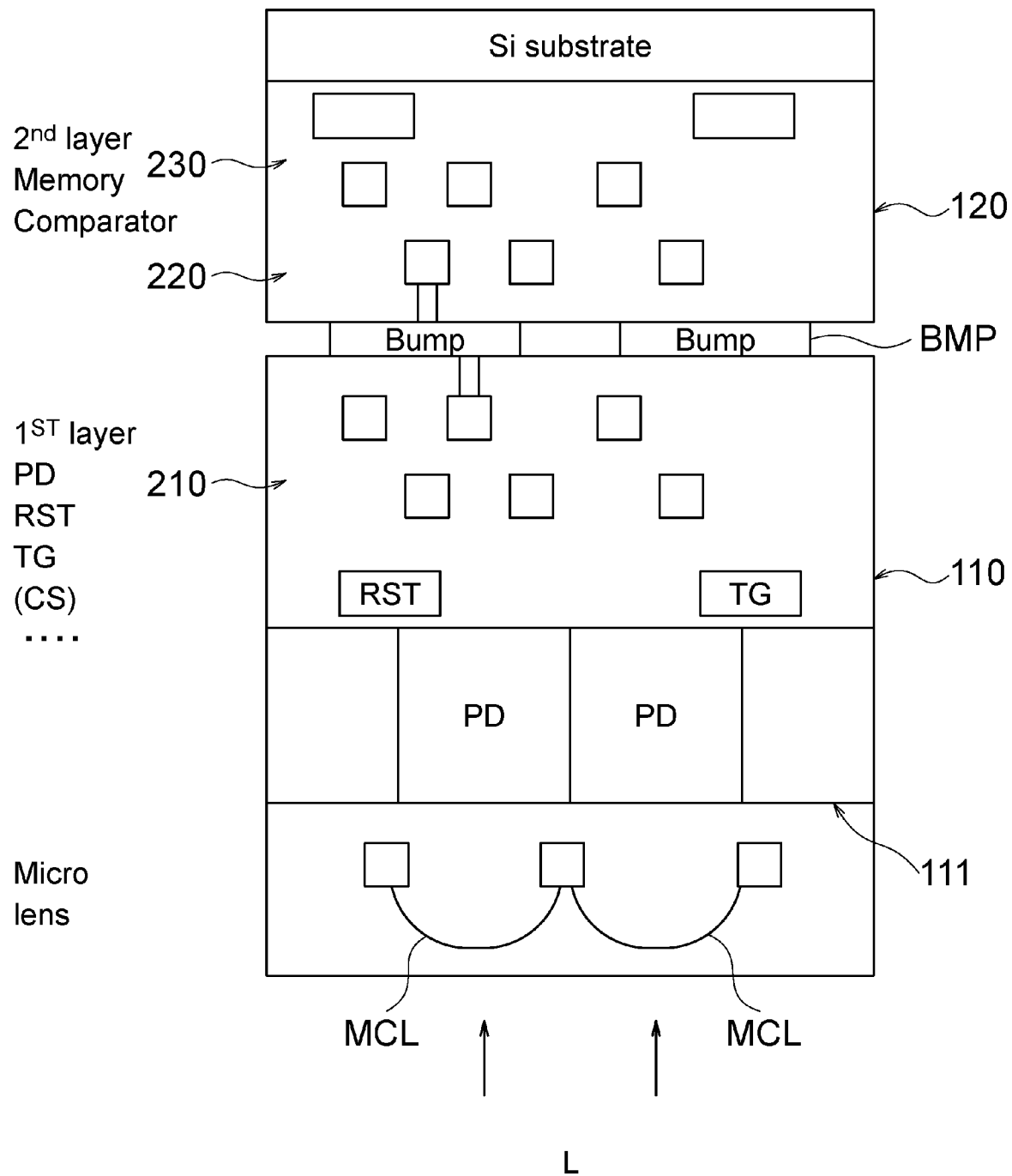
FIG. 17 is a simplified sectional view to illustrate the stacked structure of the solid-state imaging device relating to the first embodiment.

FIGS. 16A and 16B are schematic views to illustrate the stacked structure of the solid-state imaging device 10 relating to the first embodiment. FIG. 17 is a simplified sectional view to illustrate the stacked structure of the solid-state imaging device 10 relating to the first embodiment.

The solid-state imaging device 10 relating to the first embodiment has a stacked structure of a first substrate (an upper substrate) 110 and a second substrate (a lower substrate) 120. The solid-state imaging device 10 is formed as an imaging device having a stacked structure that is obtained, for example, by bonding wafers together and subjecting the bonded wafers to dicing. In the present example, the first substrate 110 and the second substrate 120 are stacked.

In the first substrate 110, the photoelectric conversion reading parts 210 of the digital pixels 200 of the pixel part 20 are arranged and centered around the central portion of the first substrate 110. In the first substrate 110, the photodiode PD is formed on a first surface 111 side thereof onto which light L is incident. On the light incident surface of the photodiode PD, a microlens MCL and a color filter are formed. In the first substrate 110, the transfer transistor TG1-Tr, the reset transistor RST1-Tr, the source follower transistor SF1-Tr, and the current transistor IC1-Tr are formed on a second surface side thereof.

As described above, basically in the first embodiment, the photoelectric conversion reading parts 210 of the digital pixels 200 are arranged in a matrix pattern in the first substrate 110.

In the second substrate 120, the AD converting parts 220 and the memory parts 230 of the digital pixels 200 are arranged in a matrix pattern. In the second substrate 120, the vertical scanning circuit 30, output circuit 40 and timing control circuit 50 may be also formed.

In the above-described stacked structure, the reading nodes ND2 of the photoelectric conversion reading parts 210 in the first substrate 110 are electrically connected to the inversion input terminals (−) of the comparators 221 of the digital pixels 200 in the second substrate 120 through vias (die-to-die vias), microbumps BMP, the signal lines LSGN1 or the like as shown in FIG. 3, for example. Furthermore, in the present embodiment, the reading nodes ND2 of the photoelectric conversion reading parts 210 in the first substrate 110 are AC coupled to the inversion input terminals (−) of the comparators 221 of the digital pixels 200 in the second substrate 120 through the coupling capacitors C221.

<Reading Operation of Solid-State Imaging Device 10>

The above has described the characteristic configurations and functions of the parts of the solid-state imaging device 10. Next, a detailed description will be given of the reading operation of the pixel signal from the digital pixel 200 in the solid-state imaging device 10 relating to the first embodiment.

Figure 18:
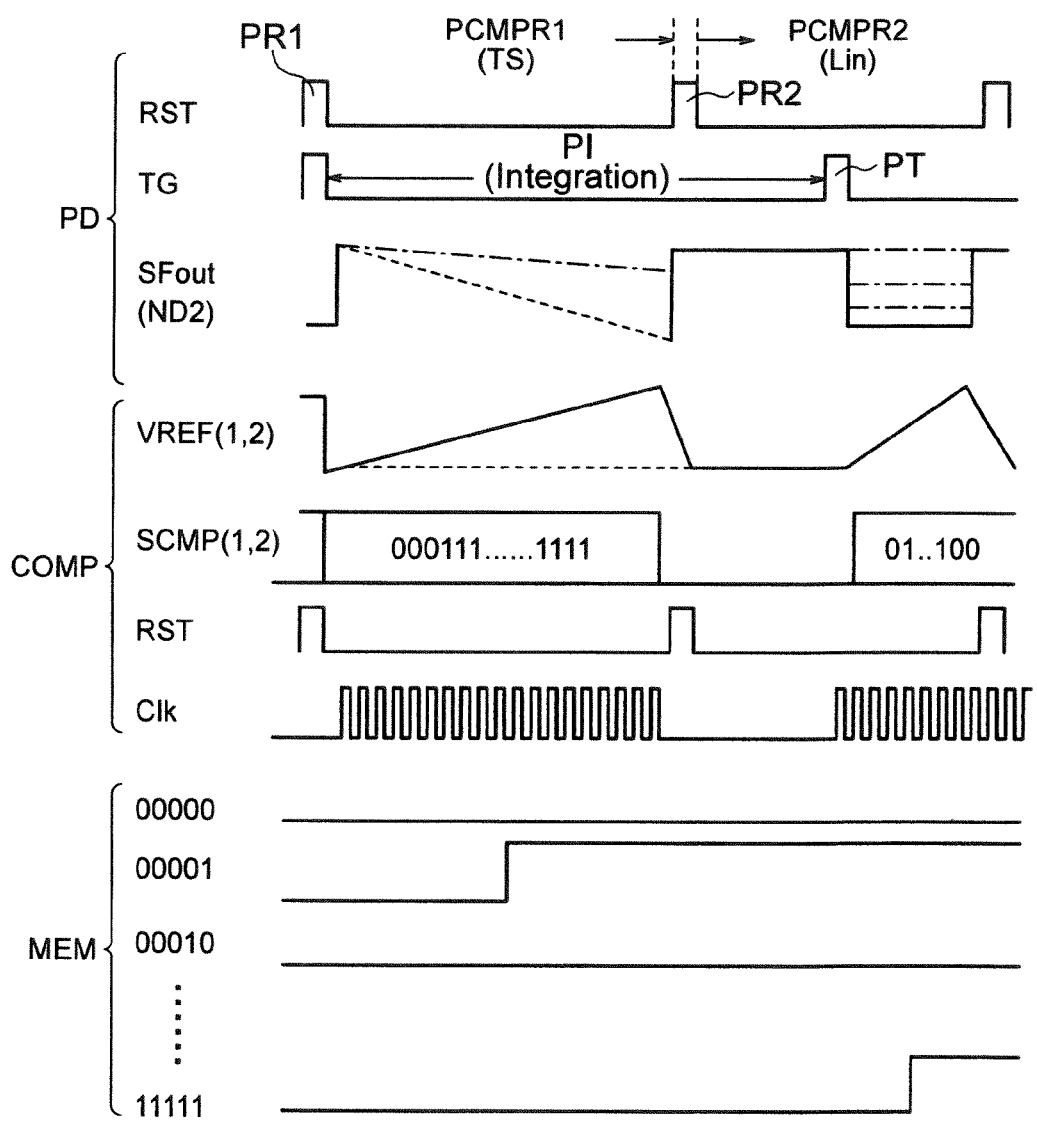
FIG. 18 is a timing chart to illustrate a reading operation performed in a predetermined shutter mode mainly by the pixel part of the solid-state imaging device relating to the first embodiment of the present invention.
Figure 19:
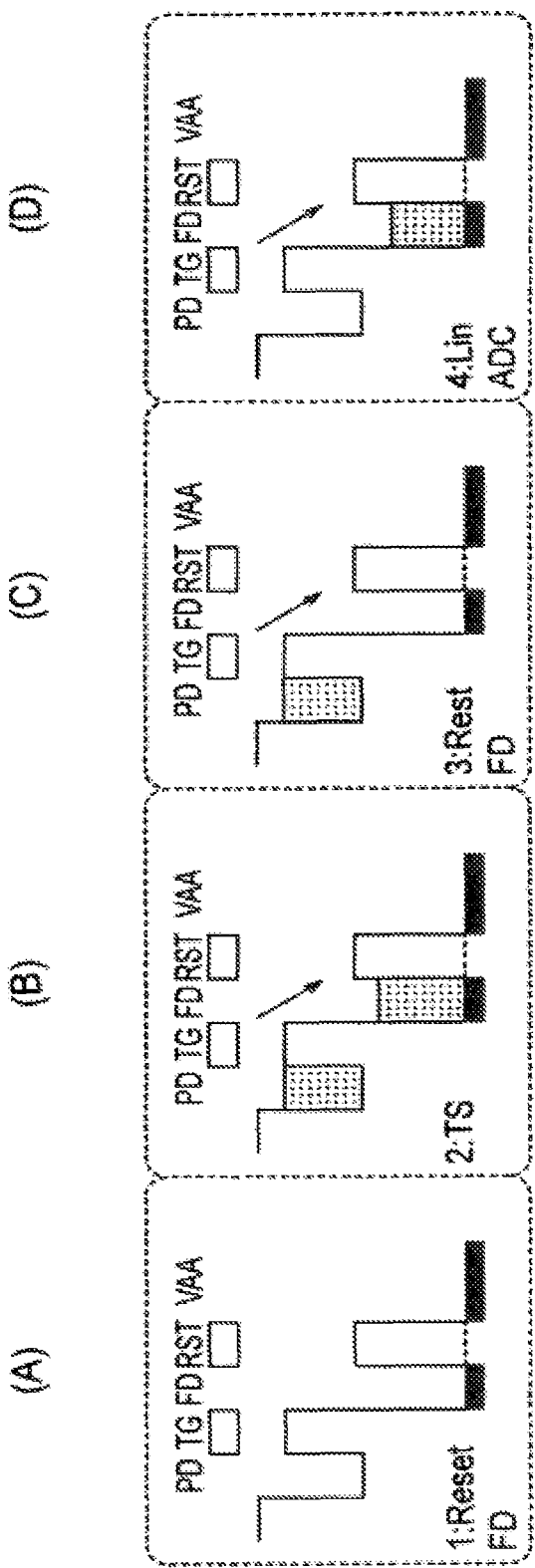
FIG. 19 includes parts (A) to (D) illustrating a sequence of operations and potential transition to explain a reading operation performed mainly by the pixel part of the solid-state imaging device relating to the first embodiment of the present invention in a predetermined shutter mode.

FIG. 18 is a timing chart to illustrate a reading operation performed in a predetermined shutter mode mainly by the pixel part of the solid-state imaging device relating to the first embodiment of the present invention. FIG. 19 includes parts (A) to (D) illustrating a sequence of operations and potential transition to explain a reading operation performed mainly by the pixel part of the solid-state imaging device relating to the first embodiment of the present invention in a predetermined shutter mode.

In order to start the reading operation, global resetting is performed to reset the photodiode PD1 and the floating diffusion FD1 in each digital pixel 200 as shown in FIG. 18 and the part (A) in FIG. 19. According to the global resetting, the reset transistor RST1-Tr and the transfer transistor TG1-Tr are brought into and remain in the conduction state for a predetermined period of time at the same time in all of the pixels, so that the photodiode PD1 and the floating diffusion FD1 are reset. Following this, the reset transistor RST1-Tr and the transfer transistor TG1-Tr are brought into the non-conduction state at the same time in all of the pixels, so that the exposure is started, in other words, the charges start to be stored in all of the pixels concurrently in parallel.

Then, as shown in FIG. 18 and the part (B) in FIG. 19, the time stamp (TS) ADC mode operation for the overflow charges starts. The overflow charges are stored in the floating diffusion FD1 in the storing period PI. The solid-state imaging device 10 operates in the time stamp ADC mode in a period within the storing period PI, more specifically, in a period within the storing period PI that lasts until the floating diffusion FD1 is reset.

In the time stamp (TS) ADC mode, the photoelectric conversion reading part 210 outputs, correspondingly to the first comparing operation period PCMP1 of the AD converting part 220, the voltage signal VSL1 corresponding to the overflow charges overflowing from the photodiode PD1 to the floating diffusion FD1 serving as an output node in the storing period PI. The comparator 221 of the AD converting part 220 performs the first comparing operation CMPR1. Under the control of the reading part 60, the comparator 221 outputs the digital first comparison result signal SCMP1 obtained by processing the voltage signal VSL1 corresponding to the overflow charges overflowing from the photodiode PD1 to the floating diffusion FD1 serving as an output node within a certain period that is included in the storing period PI and lasts until the floating diffusion FD1 is reset, and digital data corresponding to the first comparison result signal SCMP1 is stored in the memory 231 of the memory part 230.

The digital data (ADC code) is stored (written) into the SRAM 231 of the memory part 230 in the following manner. Once the AD conversion period starts, the PMOS transistor PT1 serving as the first power gating transistor PGT1 and the NMOS transistor NT1 serving as the second power gating transistor PGT2 enter the weak current source mode, by setting the signal FULL_ON at the low level and turning off the full switches FSW311 and FSW321, so that the gate voltage VBPPG of the PMOS transistor PT1 and the gate voltage VBNPG of the NMOS transistor NT1 transition to their respective target bias voltage levels Target VBPPG and Target VBNPG. The first bit line BL and the second bit line BL_B are toggled and the ADC code (ADC_CODE) is sent to and written into all of the SRAM bit cells at the ends of the ADC memory array.

Next, as shown in FIG. 18 and the part (C) in FIG. 19, the time stamp (TS) ADC mode operation for the overflow charges ends, the linear ADC mode starts and the reset period PR2 for the floating diffusion FD1 starts. In the reset period PR2, the reset transistor RST1-Tr remains in the conduction state for a predetermined period of time, so that the floating diffusion FD1 is reset. The signal (VRST) in the floating diffusion FD1 at the time of resetting is read out, and the digital signal is stored in the memory 232 in the memory part 230. After this, the reset transistor RST1-Tr is brought into the non-conduction state. In this case, the storing period PI continues.

Following this, as shown in FIG. 18 and the part (D) in FIG. 19, the storing period PI ends and the transfer period PT starts. In the transfer period PT, the transfer transistor TG1-Tr remains in the conduction state for a predetermined period of time, so that the charges stored in the photodiode PD1 are transferred to the floating diffusion FD1.

In the linear (Lin) ADC mode, the photoelectric conversion reading part 210 outputs, correspondingly to the second comparing operation period PCMP2 of the AD converting part 220, the voltage signal VSL2 corresponding to the stored charges transferred from the photodiode PD1 to the floating diffusion FD1 serving as an output node, after the storing period PI ends. The comparator 221 of the AD converting part 220 performs the second comparing operation CMPR2. Under the control of the reading part 60, the comparator 221 outputs the digital second comparison result signal SCMP2 obtained by processing the voltage signal VSL2 corresponding to the stored charges transferred from the photodiode PD1 to the floating diffusion FD1 serving as an output node, after the storing period PI, and digital data corresponding to the second comparison result signal SCMP2 is stored in the memory 232 of the memory part 230.

The signal read out by the memory part 230 is sent outside the solid-state imaging device 10 (image sensor) via, for example, the IO buffer of the output circuit 40, which is driven by reading the digital signal data from the memory node and has such an MIPI data format. This operation is globally performed in all of the pixels in the pixel array.

The ADC code is read out from the SRAM 231 of the memory part 230 in the following manner. After the AD conversion period ends and the reading period starts, the signal FULL_ON is set at the high level, so that the full switches FSW311, FSW321 are turned on. In this way, the gate voltage VBPPG of the PMOS transistor PT1 serving as the first power gating transistor PGT1 reaches 0 V, and the gate voltage VBNPG of the NMOS transistor NT1 serving as the second power gating transistor PGT2 reaches the power supply potential VDD. As a result, the power gating transistors PGT1, PGT2 are completely and strongly driven to reduce the output impedance, and the written ADC code is kept while the power supply voltage is fed.

When the power gating transistors PGT1, PGT2 are controlled to operate as a weak current source, what is saved in the bit cell is destroyed when reading is performed. This is because sufficient currents cannot be drawn when the access transistors AT1 and AT2 are opened with the word line WL being set at the high level. The bit cell needs to handle the injection of charges from the first bit line BL and the second bit line BL_B, which are precharged to a certain voltage, before the access transistors AT1, AT2 are opened.

For the reading operation, the signal FULL_ON is activated and the power gating transistor PGT1 is strongly or completely turned on to operate as a simple switch. The on resistance of the PMOS transistor PT1 is set very small as if the power gating transistor PGT1 does not exist. Under these circumstances, the power supply virtual node VPN operates in substantially the same manner as the actual power supply line VDD. Accordingly, when the access transistors AT1 and AT2 are opened, the PMOS transistor PT1 serving as the power gating transistor PGT1 feeds sufficient currents. In this way, the reading operation is successfully accomplished.

The same applies to the ground-side power gating transistor PGT2, which is controlled together with the power gating transistor PGT1.

As described above, in the solid-state imaging device 10 relating to the first embodiment, the pixel part 20 includes digital pixels, and each digital pixel includes the photoelectric conversion reading part 210, the AD converting part 220, and the memory part 230. The solid-state imaging device 10 is configured, for example, as a stacked CMOS image sensor capable of operating in a global shutter mode. In the solid-state imaging device 10 relating to the first embodiment, each digital pixel 200 has an AD converting function, and the AD converting part 220 includes the comparator 221 for performing a comparing operation of comparing the voltage signal read out from the photoelectric conversion reading part 210 against the referential voltage and outputting a digital comparison result signal.

In the SRAM 231 relating to the first embodiment, the power gating transistors PGT1, PGT2 are additionally provided to the power supply node (between the power supply and the virtual power supply node) and the ground node (between the virtual reference potential node and the reference potential) for the purposes of blocking the shoot-through currents from the bit cells during the writing operation. The power gating transistors are controlled through the first supporting circuit 310 and the second supporting circuit 320 by the reading part 60 so as to operate as either a weak current source or switch.

The SRAM 231 relating to the first embodiment significantly reduces the currents from the bit cells to which writing is being performed by blocking the route originating from the power supply. Therefore, it is expected that the present embodiment can significantly reduce the IR drop. As a result, the writing does not fail and can be performed on the SRAM at high speed. The first embodiment is capable of effectively blocking the shoot-through currents from SRAM bit cells while writing is performed on the bit cells and achieving excellent writing operations.

Under the control of the reading part 60, the comparator 221 performs the first comparing operation CMPR1 and the second comparing operation CMPR2. The first comparing operation CMPR1 is designed to output a digital first comparison result signal SCMP1 obtained by processing the voltage signal corresponding to the overflow charges that overflow from the photodiode PD1 to the output node (floating diffusion) FD1 in the storing period. The second comparing operation CMPR2 is designed to output a digital second comparison result signal SCMP2 obtained by processing the voltage signal corresponding to the charges stored in the photodiode PD1 that are transferred to the floating node FD1 (output node) in a transfer period following the storing period.

In other words, the solid-state imaging device 10 relating to the first embodiment is capable of achieving a widened dynamic range and a raised frame rate since the charges overflowing from the photodiode in the storing period can be used real time. Additionally, the present invention is capable of substantially achieving a widened dynamic range and a raised frame rate, achieving reduced noise, and maximizing the effective pixel region and value per cost.

Additionally, the solid-state imaging device 10 relating to the first embodiment can prevent the increase in the configuration complexity and the reduction in area efficiency from the perspective of layout.

The solid-state imaging device 10 relating to the first embodiment has a stacked structure of the first substrate (an upper substrate) 110 and the second substrate (a lower substrate) 120. Accordingly, the first embodiment can maximize the value per cost since the first substrate 110 is basically formed only with NMOS elements and the pixel array can increase the effective pixel region to the maximum.

Second Embodiment

Figure 20:
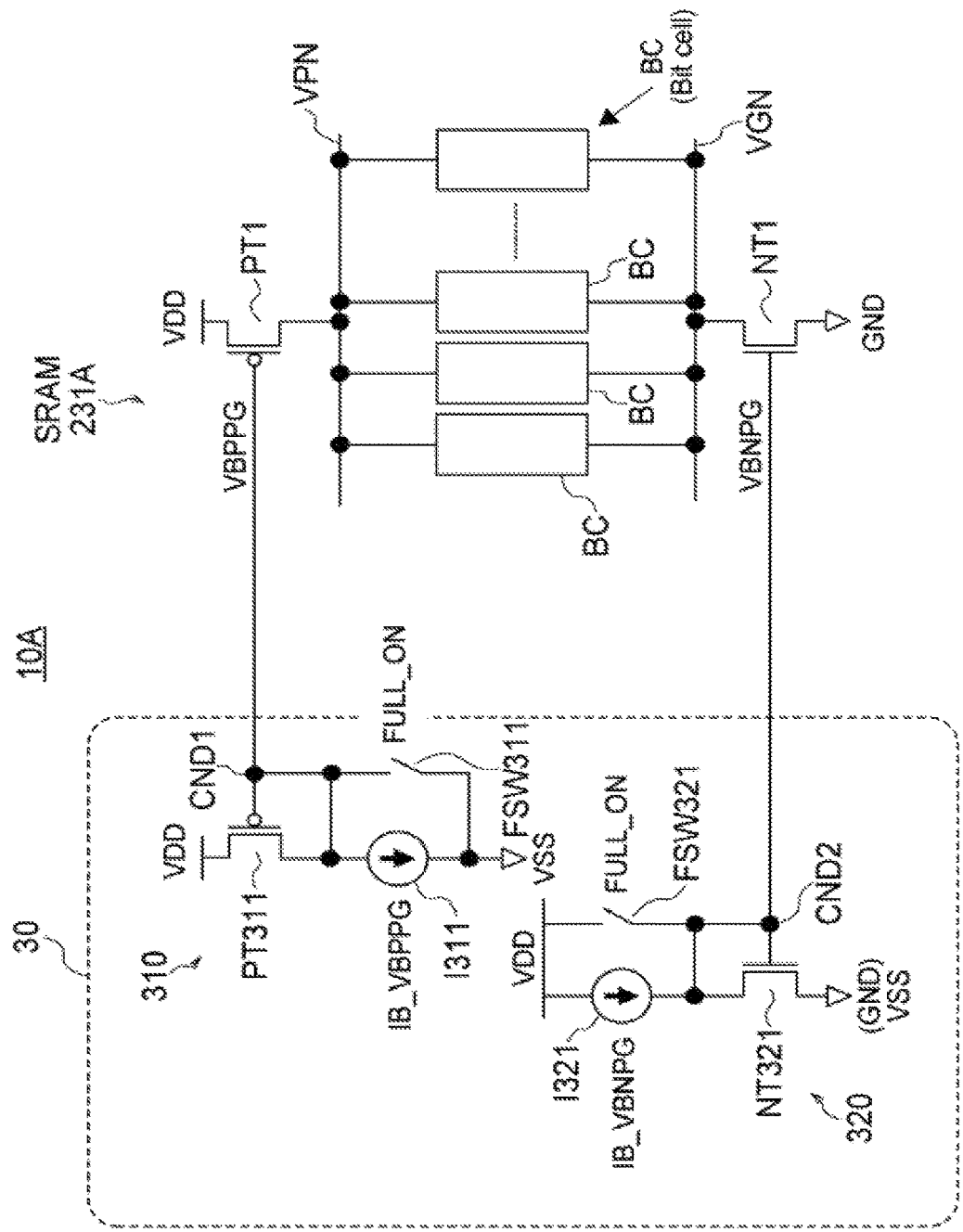
FIG. 20 is a circuit diagram showing an example configuration of an SRAM serving as an ADC memory relating to a second embodiment of the present invention.

FIG. 20 is a circuit diagram showing an example configuration of an SRAM serving as an ADC memory relating to a second embodiment of the present invention.

A solid-state imaging device 10A relating to the second embodiment differs from the solid-state imaging device 10 relating to the above-described first embodiment in the following points. In the solid-state imaging device 10A relating to the second embodiment, an SRAM 231A includes a bit cell BC including a first back-to-back inverter BINV1, a second back-to-back inverter BINV2, a first access transistor AT1 and a second access transistor AT2, and a plurality of bit cells BC are connected in parallel between the virtual power supply node VPN and the virtual ground (reference potential) node VGN.

In other words, some bit cells can form a bit cell group, which can be subjected to power gating concurrently with a set of power gating circuits. This configuration can reduce the number of necessary power gating transistors and the pixel pitch.

According to the second embodiment, the bit cells BC share the virtual power supply node VPN and the virtual ground (the reference potential) node VGN. This can effectively reduce the transistors required to realize the power gating mechanism.

Third Embodiment

Figure 21:
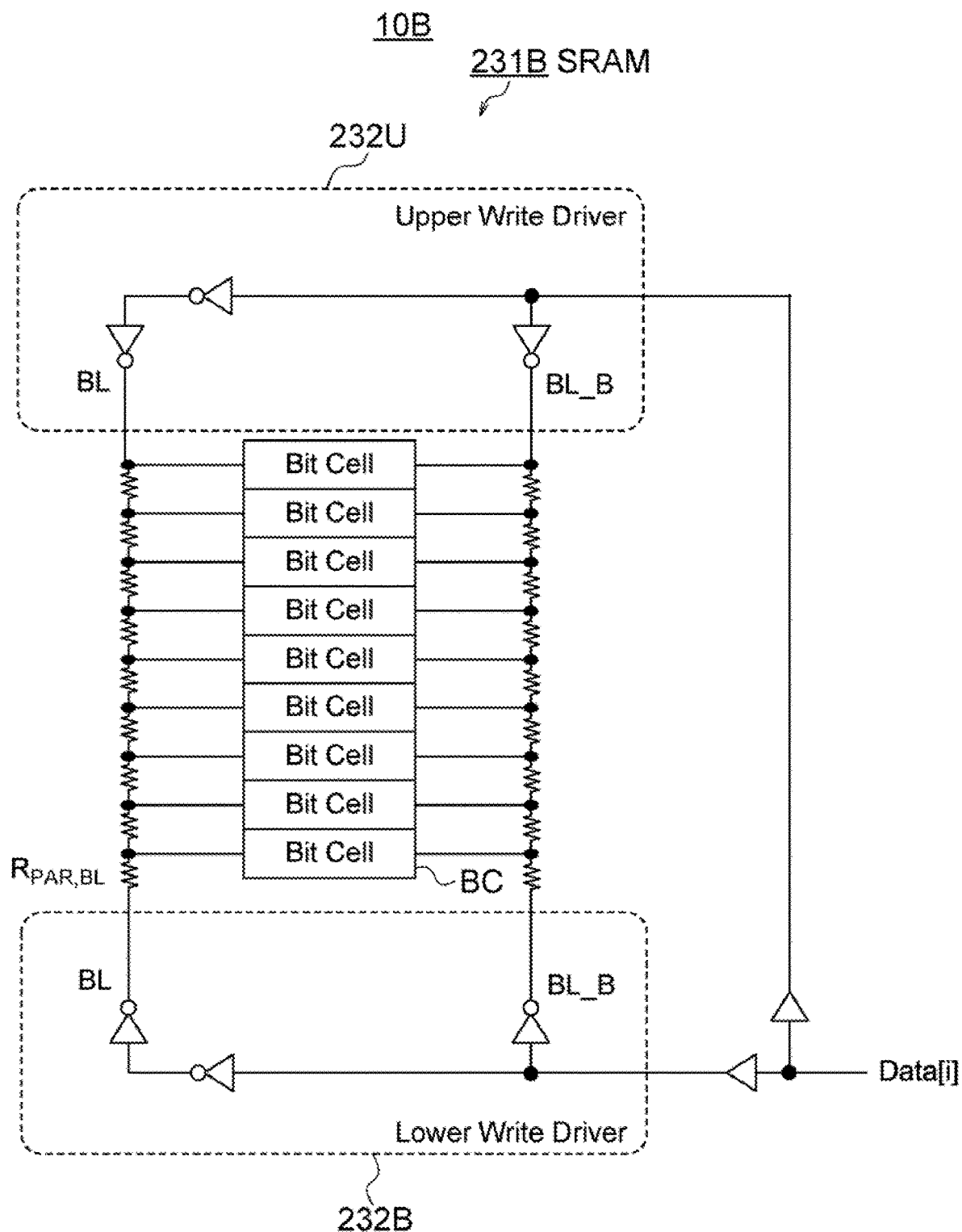
FIG. 21 is a circuit diagram showing an example configuration of an SRAM serving as an ADC memory relating to a third embodiment of the present invention.

FIG. 21 is a circuit diagram showing an example configuration of an SRAM serving as an ADC memory relating to a third embodiment of the present invention.

A solid-state imaging device 10B relating to the third embodiment differs from the solid-state imaging device 10 relating to the above-described first embodiment in the following points. In the solid-state imaging device 10B relating to the third embodiment, an SRAM 231B has writing drivers 232B and 232U arranged at the ends of the bit lines in order to effectively reduce the parasitic resistances on the bit lines BL and BL_B, so that the SRAM bit cells are driven from both ends.

It is critical to reduce the parasitic resistances on the bit lines BL and BL_B. Since the IR drop is caused by the currents originating from the bit cells BC and flowing through the parasitic resistances, stronger writing drivers do not help. In order to ensure writing to be performed properly, reducing the currents from the bit cells BC is not enough, and reducing the parasitic resistances of the bit cells is essential. In the third embodiment, writing drivers are additionally provided at the ends of the bit lines and one writing driver is only required to drive substantially half the parasitic resistance. This configuration can possibly half the IR drop.

Fourth Embodiment

Figure 22:
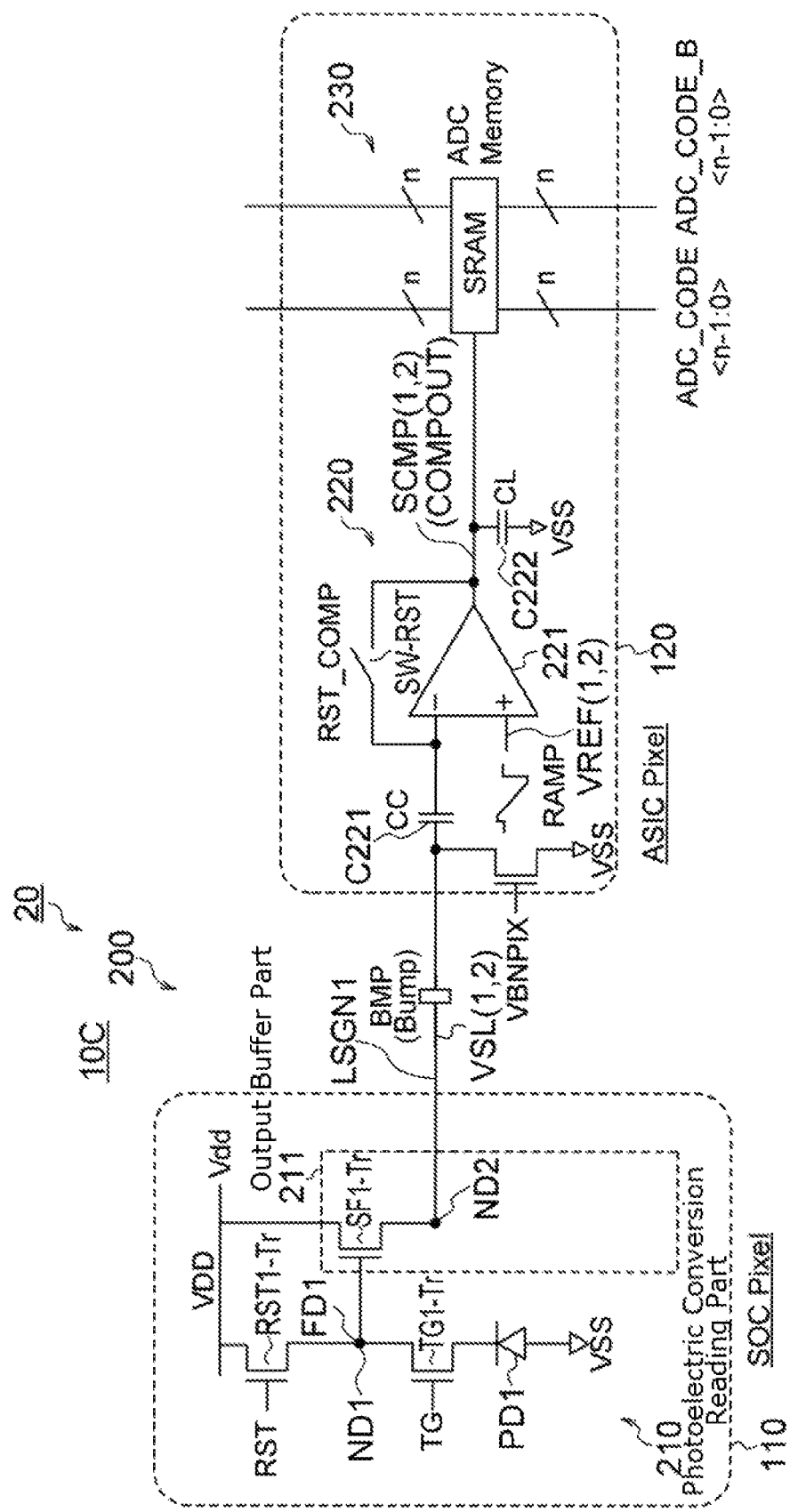
FIG. 22 is a circuit diagram showing an example configuration of an SRAM serving as an ADC memory relating to a fourth embodiment of the present invention.

FIG. 22 is a diagram showing an example configuration of a pixel of a solid-state imaging device relating to a fourth embodiment of the present invention.

A solid-state imaging device 10C relating to the fourth embodiment differs from the solid-state imaging device 10 relating to the above-described first embodiment in the following points. In the solid-state imaging device 10C relating to the fourth embodiment, the current transistor IC1-Tr serving as a current source is not arranged on the first substrate 110 but arranged, for example, on the second substrate 120 at the input of the AD converting part 220.

The fourth embodiment can produce the same effects as the above-described first embodiment.

Fifth Embodiment

Figure 23:
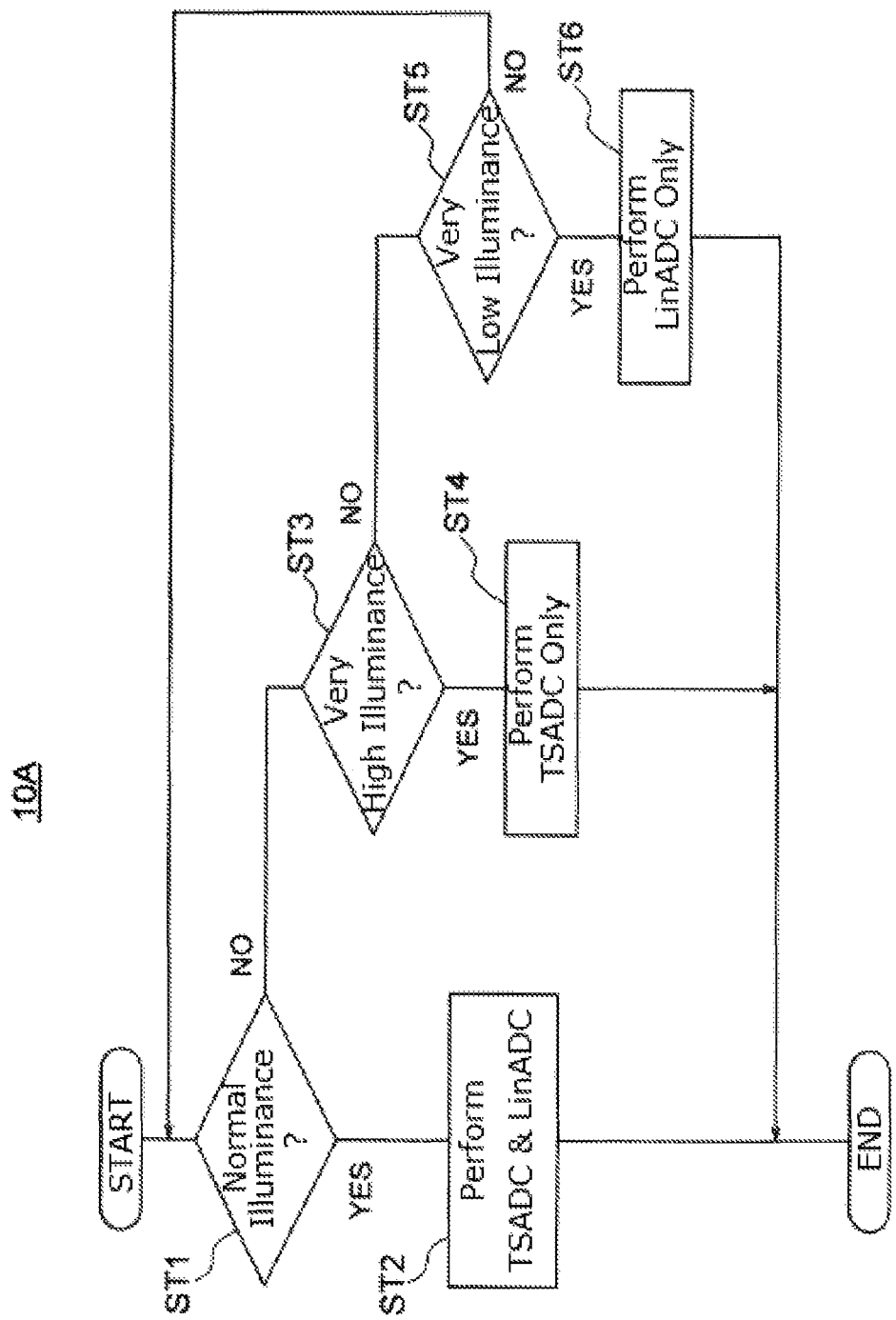
FIG. 23 is used to illustrate a solid-state imaging device relating to a fifth embodiment of the present invention and shows, as an example, how to make a selection between a time stamp ADC mode operation and a linear ADC mode operation.

FIG. 23 is used to illustrate a solid-state imaging device relating to a fifth embodiment of the present invention and shows, as an example, how to make a selection between a time stamp ADC mode operation and a linear ADC mode operation.

A solid-state imaging device 10D relating to the fifth embodiment differs from the solid-state imaging device 10 relating to the above-described first embodiment in the following points. The solid-state imaging device 10 relating to the first embodiment of the present invention operates in the time stamp (TS) ADC mode and the linear (Lin) ADC mode successively.

The solid-state imaging device 10D relating to the fifth embodiment of the present invention, on the other hand, can selectively operate in the time stamp (TS) ADC mode and the linear (Lin) ADC mode depending on the illuminance.

According to the example shown in FIG. 23, in the case of normal illuminance (ST1), the solid-state imaging device 10D successively operates in the time stamp ADC mode and the linear ADC mode (ST2). When the illuminance is not normal but very (extremely) high (ST1, ST3), the solid-state imaging device 10D operates only in the time stamp ADC mode (ST4) since there is a high possibility that the charges may overflow from the photodiode PD1 to the floating diffusion FD1. When the illuminance is neither normal nor very (extremely) high, but very (extremely) low (ST1, ST3, ST5), the solid-state imaging device 10D operates only in the linear ADC mode (ST6) since there is a very low possibility that the charges may overflow from the photodiode PD1 to the floating diffusion FD1.

The fifth embodiment makes it possible not only to obtain the same effect as the first embodiment described above, but also to realize faster reading operation and achieve lower power consumption.

The solid-state imaging devices 10, 10A, 10B, 10C and 10D described above can be applied, as an imaging device, to electronic apparatuses such as digital cameras, video cameras, mobile terminals, surveillance cameras, and medical endoscope cameras.

Figure 24:
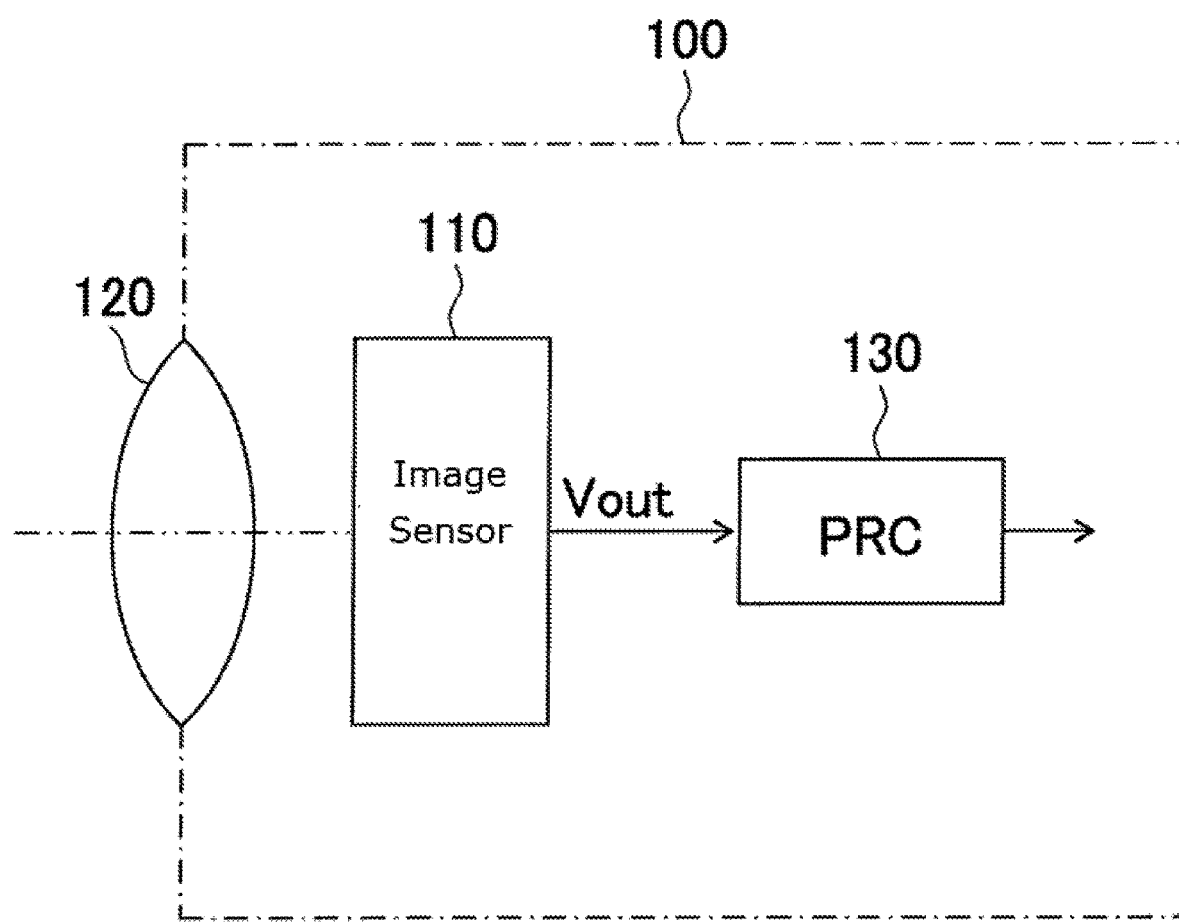
FIG. 24 shows an example configuration of an electronic apparatus to which the solid-state imaging devices relating to the embodiments of the present invention can be applied.

FIG. 24 shows an example of the configuration of an electronic apparatus including a camera system to which the solid-state imaging devices relating to the embodiments of the present invention are applied.

As shown in FIG. 24, the electronic apparatus 100 includes a CMOS image sensor 110 that can be constituted by the solid-state imaging device 10 relating to the embodiment of the present invention. Further, the electronic apparatus 100 includes an optical system (such as a lens) 120 for redirecting the incident light to pixel regions of the CMOS image sensor 110 (to form a subject image). The electronic apparatus 100 includes a signal processing circuit (PRC) 130 for processing output signals of the CMOS image sensor 310.

The signal processing circuit 130 performs predetermined signal processing on the output signals of the CMOS image sensor 110. The image signals processed in the signal processing circuit 130 can be handled in various manners. For example, the image signals can be displayed as a video image on a monitor having a liquid crystal display, or the image signals can be printed by a printer or recorded directly on a storage medium such as a memory card.

As described above, a high-performance, compact, and low-cost camera system can be provided that includes the solid-state imaging device 10, 10A, 10B, 10C and 10D as the CMOS image sensor 310. Further, it is possible to produce electronic apparatuses such as surveillance cameras and medical endoscope cameras that are used for applications where cameras are required to be installed under restricted conditions such as the installation size, number of connectable cables, cable length, and installation height.

What is claimed is:
1. A solid-state imaging device comprising:
a pixel part having a pixel arranged therein, the pixel performing photoelectric conversion; and
a reading part for reading a pixel signal from the pixel in the pixel part,
wherein the pixel has:
    a photoelectric conversion element for storing therein, in a storing period, charges generated by the photoelectric conversion;
    a transfer element for transferring, in a transfer period following the storing period, the charges stored in the photoelectric conversion element;
    an output node to which the charges stored in the photoelectric conversion element are transferred through the transfer element;
    an output buffer part for converting the charges in the output node into a voltage signal at a level determined by the amount of the charges and outputting the voltage signal;
    a comparator for performing, for analog-to-digital (AD) conversion, a comparing operation of comparing the voltage signal output from the output buffer part against a referential voltage to output a digital comparison result signal; and
    a memory part for saving analog-to-digital code (ADC) data corresponding to the comparison result signal from the comparator,
    wherein the memory part is formed using a static random access memory (SRAM), and an ADC code is written into and read from the memory part under control of the reading part,
    wherein the SRAM includes:
        a first bit line and a second bit line;
        a power supply;
        a reference potential;
        a virtual power supply node;
        a virtual reference potential node;
        a first first-conductivity-type transistor connected between the power supply and the virtual power supply node;

a first second-conductivity-type transistor connected between the reference potential and the virtual reference potential node;

a first back-to-back inverter including a second first-conductivity-type transistor having a source connected to the virtual power supply node and a second second-conductivity-type transistor having a source connected to the virtual reference potential node, a gate of the second first-conductivity-type transistor being connected to a gate of the second second-conductivity-type transistor to form a first input node, a drain of the second first-conductivity-type transistor being connected to a drain of the second second-conductivity-type transistor to form a first output node;

a second back-to-back inverter including a third first-conductivity-type transistor having a source connected to the virtual power supply node and a third second-conductivity-type transistor having a source connected to the virtual reference potential node, a gate of the third first-conductivity-type transistor being connected to a gate of the third second-conductivity-type transistor to form a second input node, a drain of the third first-conductivity-type transistor being connected to a drain of the third second-conductivity-type transistor to form a second output node;

a first access transistor connected between the first output node and the first bit line; and a second access transistor connected between the second output node and the second bit line, and wherein the first input node is connected to the second output node, and the second input node is connected to the first output node.

2. The solid-state imaging device according to claim 1, wherein the reading part controls a gate voltage of at least the first first-conductivity-type transistor selected from among the first first-conductivity-type transistor and the first second-conductivity-type transistor so that at least the first first-conductivity-type transistor operates as a weak current source or switch.

3. The solid-state imaging device according to claim 2, wherein the reading part:

controls the gate voltage of at least the first first-conductivity-type transistor so that at least the first first-conductivity-type transistor operates as a weak current source, in an AD conversion period in which AD conversion is performed and an ADC code is written; and controls the gate voltage of at least the first first-conductivity-type transistor so that at least the first first-conductivity-type transistor operates as a switch in a reading period following the AD conversion period.

4. The solid-state imaging device according to claim 3, wherein the reading part includes:

a first supporting circuit for controlling the gate voltage of the first first-conductivity-type transistor; and a second supporting circuit for controlling the gate voltage of the first second-conductivity-type transistor, wherein the first supporting circuit includes:

a first control node connected to a gate of the first first-conductivity-type transistor of the SRAM;

a current mirror first-conductivity-type transistor connected at a source thereof to the power supply and at a gate and a drain thereof to the first control node;

a first current source connected between the drain of the current mirror first-conductivity-type transistor and the reference potential; and a first full switch connected between the first control node and the reference potential, and wherein the second supporting circuit includes:

a second control node connected to a gate of the first second-conductivity-type transistor of the SRAM;

a current mirror second-conductivity-type transistor connected at a source thereof to the reference potential and at a gate and a drain thereof to the second control node;

a second current source connected between the power supply and the drain of the current mirror second-conductivity-type transistor; and a second full switch connected between the second control node and the power supply.

5. The solid-state imaging device according to claim 4, wherein the reading part:

in the AD conversion period, brings the first full switch and the second full switch into a non-conduction state to cause the gate voltage of the first first-conductivity-type transistor and the gate voltage of the first second-conductivity-type transistor to transition to respective target bias voltage levels in order to achieve a weak current source mode; and in the reading period, brings the first full switch and the second full switch into a conduction state to cause the gate voltage of the first first-conductivity-type transistor to transition to a reference potential level in order to cause the virtual power supply node to operate as a power supply line and to cause the gate voltage of the first second-conductivity-type transistor to transition to a power supply voltage level in order to cause the virtual reference potential node to operate as a reference potential.

6. The solid-state imaging device according to claim 1, wherein at least the first back-to-back inverter, the second back-to-back inverter, the first access transistor and the second access transistor together form a bit cell, and wherein a plurality of bit cells are connected in parallel between the virtual power supply node and the virtual reference potential node.

7. The solid-state imaging device according to claim 1, wherein a writing driver is connected to ends of the first bit line and ends of the second bit line.

8. The solid-state imaging device according to claim 1, wherein the comparator is configured to perform, under control of the reading part:

a first comparing operation of outputting a digital first comparison result signal obtained by processing the voltage signal corresponding to the overflow charges overflowing from the photoelectric conversion element to the output node in the storing period; and a second comparing operation of outputting a digital second comparison result signal obtained by processing the voltage signal corresponding to charges stored in the photoelectric conversion element that are transferred to the output node in the transfer period following the storing period.

9. The solid-state imaging device according to claim 8, wherein, as a result of the first comparing operation, the comparator outputs the first comparison result signal corresponding to a time determined by the amount of the overflow charges.

10. The solid-state imaging device according to claim 9, wherein in the first comparing operation, the comparator is configured to handle a light level as long as the light level produces a signal level ranging from (i) a signal level of the photoelectric conversion element obtained with a maximum value of a sampling time that is required to cause the overflow charges to start overflowing from the photoelectric conversion element to the output node to (ii) a signal level obtained with a minimum value of the sampling time.

11. The solid-state imaging device according to claim 8, wherein the storing period is a period from when the photoelectric conversion element and the output node are reset to a reset level to when the transfer period starts as the transfer element is brought into a conduction state,
wherein a period of the first comparing operation is a period from when the photoelectric conversion element and the output node are reset to a reset level and to when the output node is reset to a reset level before the transfer period starts, and
wherein a period of the second comparing operation is a period that starts after the output node is reset to a reset level and that includes a period after the transfer period.

12. The solid-state imaging device according to claim 8, wherein the reading part controls the first comparing operation and the second comparing operation such that the first and second comparing operations are selectively performed depending on illuminance.

13. The solid-state imaging device according to claim 1, wherein the pixel has:
a floating diffusion serving as the output node; and
a reset element for resetting, in a reset period, the floating diffusion to a predetermined potential, and
wherein the output buffer part includes:
a source follower element for converting charges in the floating diffusion into a voltage signal at a level determined by the amount of the charges and outputting the voltage signal; and
a current source connected to a source of the source follower element.

14. The solid-state imaging device according to claim 1, wherein the comparator receives at a first input terminal thereof the voltage signal fed from the output buffer part and receives at a second input terminal thereof the referential voltage fed thereto, and
wherein a coupling capacitor is connected to a line to feed the voltage signal to the first input terminal.

15. The solid-state imaging device according to claim 1, wherein the comparator has:
a reset switch connected between an output terminal and the first input terminal; and
a load capacitor connected to the output terminal.

16. The solid-state imaging device according to claim 1, comprising:
a first substrate; and
a second substrate,
wherein the first substrate and the second substrate have a stacked structure in which the first substrate and the second substrate are connected through a connection part,
wherein the first substrate at least has the photoelectric conversion element, the transfer element, the output node and the output buffer part of the pixel formed therein, and
wherein the second substrate at least has at least a portion of the reading part, the memory part, and the comparator formed therein.

17. The solid-state imaging device according to claim 16, wherein the pixel has:
a floating diffusion serving as the output node; and
a reset element for resetting, in a reset period, the floating diffusion to a predetermined potential, and
wherein the output buffer part includes:
a source follower element for converting charges in the floating diffusion into a voltage signal at a level determined by the amount of the charges and outputting the voltage signal; and
a current source connected to a source of the source follower element,
wherein the floating diffusion, the reset element and the source follower element are formed in the first substrate, and
wherein the current source is formed in the first substrate or the second substrate.

18. A method for driving a solid-state imaging device, the solid-state imaging device including:
a pixel part having a pixel arranged therein, the pixel performing photoelectric conversion; and
a reading part for reading a pixel signal from the pixel in the pixel part,
wherein the pixel has:
a photoelectric conversion element for storing therein, in a storing period, charges generated by the photoelectric conversion;
a transfer element for transferring, in a transfer period following the storing period, the charges stored in the photoelectric conversion element;
an output node to which the charges stored in the photoelectric conversion element are transferred through the transfer element;
an output buffer part for converting the charges in the output node into a voltage signal at a level determined by the amount of the charges and outputting the voltage signal;
a comparator for performing, for analog-to-digital (AD) conversion, a comparing operation of comparing the voltage signal output from the output buffer part against a referential voltage to output a digital comparison result signal; and
a memory part for saving analog-to-digital code (ADC) data corresponding to the comparison result signal from the comparator,
wherein the memory part is formed using static random access memory (SRAM), and an ADC code is written into and read from the memory part under control of the reading part,
wherein the SRAM includes:
a first bit line and a second bit line;
a power supply;
a reference potential;
a virtual power supply node;
a virtual reference potential node;
a first first-conductivity-type transistor connected between the power supply and the virtual power supply node;
a first second-conductivity-type transistor connected between the reference potential and the virtual reference potential node;
a first back-to-back inverter including a second first-conductivity-type transistor having a source connected to the virtual power supply node and a second second-conductivity-type transistor having a source connected to the virtual reference potential node, a gate of the second first-conductivity-type transistor being connected to a gate of the second second-conductivity-type transistor to form a first input node, a drain of the second first-conductivity-type transistor being connected to a drain of the second second-conductivity-type transistor to form a first output node;

a second back-to-back inverter including a third first-conductivity-type transistor having a source connected to the virtual power supply node and a third second-conductivity-type transistor having a source connected to the virtual reference potential node, a gate of the third first-conductivity-type transistor being connected to a gate of the third second-conductivity-type transistor to form a second input node, a drain of the third first-conductivity-type transistor being connected to a drain of the third second-conductivity-type transistor to form a second output node;

a first access transistor connected between the first output node and the first bit line; and a second access transistor connected between the second output node and the second bit line, wherein the first input node is connected to the second output node, and the second input node is connected to the first output node, wherein, when the pixel signal is read out from the pixel, in the memory part, under control of the reading part, a gate voltage of at least the first first-conductivity-type transistor selected from among the first first-conductivity-type transistor and the first second-conductivity-type transistor is controlled so that at least the first first-conductivity-type transistor operates as a weak current source or switch, the gate voltage of at least the first first-conductivity-type transistor is controlled such that at least the first first-conductivity-type transistor operates as a weak current source in an AD conversion period in which AD conversion is performed and an ADC code is written, and the gate voltage of at least the first first-conductivity-type transistor is controlled such that at least the first first-conductivity-type transistor operates as a switch in a reading period following the AD conversion period.

19. An electronic apparatus comprising:
a solid-state imaging device; and
an optical system for forming a subject image on the solid-state imaging device,
wherein the solid-state imaging device includes:
a pixel part having a pixel arranged therein, the pixel performing photoelectric conversion; and
a reading part for reading a pixel signal from the pixel in the pixel part,
wherein the pixel has:
a photoelectric conversion element for storing therein, in a storing period, charges generated by the photoelectric conversion;
a transfer element for transferring, in a transfer period following the storing period, the charges stored in the photoelectric conversion element;
an output node to which the charges stored in the photoelectric conversion element are transferred through the transfer element;

an output buffer part for converting the charges in the output node into a voltage signal at a level determined by the amount of the charges and outputting the voltage signal;

a comparator for performing, for analog-to-digital (AD) conversion, a comparing operation of comparing the voltage signal output from the output buffer part against a referential voltage to output a digital comparison result signal; and a memory part for saving analog-to-digital code (ADC) data corresponding to the comparison result signal from the comparator, wherein the memory part is formed using static random access memory (SRAM), and an ADC code is written into and read from the memory part under control of the reading part, wherein the SRAM includes:
a first bit line and a second bit line;
a power supply;
a reference potential;
a virtual power supply node;
a virtual reference potential node;
a first first-conductivity-type transistor connected between the power supply and the virtual power supply node;
a first second-conductivity-type transistor connected between the reference potential and the virtual reference potential node;
a first back-to-back inverter including a second first-conductivity-type transistor having a source connected to the virtual power supply node and a second second-conductivity-type transistor having a source connected to the virtual reference potential node, a gate of the second first-conductivity-type transistor being connected to a gate of the second second-conductivity-type transistor to form a first input node, a drain of the second first-conductivity-type transistor being connected to a drain of the second second-conductivity-type transistor to form a first output node;

a second back-to-back inverter including a third first-conductivity-type transistor having a source connected to the virtual power supply node and a third second-conductivity-type transistor having a source connected to the virtual reference potential node, a gate of the third first-conductivity-type transistor being connected to a gate of the third second-conductivity-type transistor to form a second input node, a drain of the third first-conductivity-type transistor being connected to a drain of the third second-conductivity-type transistor to form a second output node;

a first access transistor connected between the first output node and the first bit line; and a second access transistor connected between the second output node and the second bit line, wherein the first input node is connected to the second output node, and the second input node is connected to the first output node.

* * * * *